United States Patent
Shirvani et al.

(10) Patent No.: US 8,099,066 B1
(45) Date of Patent: *Jan. 17, 2012

(54) SYSTEM AND METHOD FOR CONTROLLING TRUE OUTPUT POWER OF A TRANSMITTER

(75) Inventors: Alireza Shirvani, San Jose, CA (US); Lawrence Tse, Fremont, CA (US)

(73) Assignee: Marvell International Ltd., Hamilton (BM)

(*) Notice: Subject to any disclaimer, the term of this patent is extended or adjusted under 35 U.S.C. 154(b) by 643 days.

This patent is subject to a terminal disclaimer.

(21) Appl. No.: 12/287,194

(22) Filed: Oct. 7, 2008

Related U.S. Application Data

(63) Continuation of application No. 10/673,263, filed on Sep. 30, 2003, now Pat. No. 7,433,658.

(51) Int. Cl.
*H01Q 11/12* (2006.01)
*H04B 1/04* (2006.01)
(52) U.S. Cl. .............. 455/127.1; 455/126; 455/127.2
(58) Field of Classification Search .......... 455/126, 455/127.1, 69, 522
See application file for complete search history.

(56) References Cited

U.S. PATENT DOCUMENTS

| | | | |
|---|---|---|---|
| 4,257,123 A | | 3/1981 | Birt et al. |
| 4,312,032 A | * | 1/1982 | Kirby ..................... 363/97 |
| 4,727,874 A | * | 3/1988 | Bowers et al. ............ 606/38 |
| 5,113,525 A | * | 5/1992 | Andoh ................. 455/127.2 |
| 5,129,098 A | | 7/1992 | McGirr et al. |
| 5,305,468 A | * | 4/1994 | Bruckert et al. .......... 455/69 |
| 5,442,322 A | | 8/1995 | Kornfeld et al. |
| 6,108,527 A | | 8/2000 | Urban et al. |
| 6,151,509 A | | 11/2000 | Chorey |
| 6,169,907 B1 | * | 1/2001 | Chang et al. .............. 455/522 |
| 6,173,163 B1 | * | 1/2001 | Northcutt ................. 455/126 |
| 6,253,092 B1 | * | 6/2001 | Nguyen et al. ............ 455/522 |
| 6,289,205 B1 | | 9/2001 | Pollanen et al. |
| 6,351,189 B1 | * | 2/2002 | Hirvilampi ............... 330/296 |
| 6,430,402 B1 | | 8/2002 | Agahi-Kesheh |
| 6,472,860 B1 | | 10/2002 | Tran et al. |
| 6,531,860 B1 | | 3/2003 | Zhou et al. |
| 6,924,698 B2 | * | 8/2005 | Camnitz et al. ............ 330/140 |

(Continued)

FOREIGN PATENT DOCUMENTS

EP     1093222     3/2000

(Continued)

OTHER PUBLICATIONS

USPTO Non-Final Office Action mailed Jan. 27, 2006 for U.S. Appl. No. 10/673,263, filed Sep. 30, 2003.

(Continued)

*Primary Examiner* — Duc M Nguyen

(57) ABSTRACT

A transmitter power control system includes a voltage detector that generates a voltage signal that is proportional to an output voltage of a power amplifier of a transmitter. A voltage scaler scales the output voltage of the power amplifier using a voltage scaling ratio. A voltage scaling ratio controller adjusts the voltage scaling ratio to maintain the voltage signal within a predetermined voltage range. A current detector generates a current signal that is proportional to an output current of the power amplifier and includes a current scaler that scales the output current using a predetermined current scaling ratio. A power detector generates a power signal that is based on the current signal and the voltage signal and is proportional to an output power of the power amplifier. A power controller generates a control signal to vary the output power based on a comparison of the power signal with at least one predetermined threshold.

18 Claims, 18 Drawing Sheets

U.S. PATENT DOCUMENTS

| | | | |
|---|---|---|---|
| 7,433,658 B1 * | 10/2008 | Shirvani-Mahdavi et al. | 455/127.2 |
| 2002/0180408 A1 * | 12/2002 | McDaniel et al. | 323/211 |
| 2004/0266371 A1 | 12/2004 | Summers et al. | |

FOREIGN PATENT DOCUMENTS

| | | |
|---|---|---|
| WO | WO 0019572 | 4/2000 |

OTHER PUBLICATIONS

Amendment filed Apr. 27, 2006 in response to USPTO Non-Final Office Action mailed Jan. 27, 2006 for U.S. Appl. No. 10/673,263, filed Sep. 30, 2003.

USPTO Final Office Action mailed Jun. 5, 2006 for U.S. Appl. No. 10/673,263, filed Sep. 30, 2003.

Amendment filed Sep. 5, 2006 in response to USPTO Final Office Action mailed Jun. 5, 2006 for U.S. Appl. No. 10/673,263, filed Sep. 30, 2003.

USPTO Non-Final Office Action mailed Jan. 4, 2007 for U.S. Appl. No. 10/673,263, filed Sep. 30, 2003.

Response filed Apr. 4, 2008 in response to USPTO Non-Final Office Action mailed Jan. 4, 2007 for U.S. Appl. No. 10/673,263, filed Sep. 30, 2003.

USPTO Final Office Action mailed Jul. 2, 2007 for U.S. Appl. No. 10/673,263, filed Sep. 30, 2003.

Amendment filed Sep. 25, 2007 in response to USPTO Non-Final Office Action mailed Jul. 2, 2007 for U.S. Appl. No. 10/673,263, filed Sep. 30, 2003.

* cited by examiner

SYSTEM AND METHOD FOR CONTROLLING TRUE OUTPUT POWER OF A TRANSMITTER

CROSS-REFERENCE TO RELATED APPLICATION

This application is a continuation of U.S. patent application Ser. No. 10/673,263, filed Sep. 30, 2003. The disclosure of the above application is incorporated herein by reference in its entirety.

BACKGROUND

1. Field of the Invention

The present invention relates to communication systems. More particularly, the present invention relates to a system and method for controlling the true output power of a transmitter.

2. Background Information

Cellular telephones, Personal Communication Service (PCS) radio devices, and other communication devices use one or more power amplifiers to transmit power through an antenna to a remote receiving station, another communication device(s), or the like. However, in many such applications, the radio frequency (RF) power output of the communication device must be precisely controlled. For example, battery capacity may need to be conserved in portable devices when low power transmission is permissible or transmitted power may need to be maintained within acceptable governmentally-regulated limits at all times.

To control the power amplifier, a closed loop power control circuit can be used. In such a closed loop system, a power detector circuit can be used to determine a measure of the output power level of the power amplifier based on the output voltage of the power amplifier. Typically, the power detector circuit is designed using a diode-based detector, sensing the voltage at the output of the power amplifier. The diode-based detector detects the peak of the output voltage of the power amplifier. The detected peak voltage is compared against a predefined voltage threshold to generate an error signal. The error signal can then be used to control the output voltage level of the power amplifier. If the impedance seen by the power amplifier (e.g., an antenna or other load) varies little, then by controlling the output voltage signal level, such a method can control the output power of the power amplifier. By varying the predefined threshold, the output power level of the power amplifier can then be controlled by controlling the output voltage of the power amplifier.

The voltage signal at the output of the power amplifier is a function of the impedance of the antenna or other load. Consequently, controlling the output power of the power amplifier by controlling the output voltage assumes that there is little variation in the impedance seen by the power amplifier. However, with different impedances, the output voltage signal amplitude will differ for a given output power. Thus, precision of such a method in controlling the output power of the power amplifier based on an output voltage measurement is limited by the variation in impedance seen by the power amplifier resulting from, for example, component variation of off-chip matching network elements, impedance variations due to manufacturing, a change in the antenna ambient or the like.

SUMMARY OF THE INVENTION

A system and method are disclosed for controlling the true output power of a transmitter. In accordance with exemplary embodiments, according to a first aspect of the present invention, a system for controlling true output power of a transmitter includes a voltage detector in communication with a power amplifier of the transmitter for detecting an output voltage of the power amplifier. The voltage detector generates a voltage signal that is proportional to the output voltage of the power amplifier. The system includes a current detector in communication with the power amplifier for detecting an output current of the power amplifier. The current detector generates a current signal that is proportional to the output current of the power amplifier. The system includes a power detector in communication with the voltage detector and the current detector for detecting a true output power delivered by the power amplifier. The power detector comprises a multiplier for multiplying the current signal and the voltage signal to generate a power signal. The power signal is proportional to the true output power delivered by the power amplifier. The system also includes a power controller in communication with the power detector and the power amplifier for controlling the power amplifier to regulate the true output power delivered by the power amplifier based on the power signal.

According to the first aspect, the voltage signal can comprise a fundamental frequency component of the output voltage of the power amplifier, the current signal can comprise a fundamental frequency component of the output current of the power amplifier, and the power signal can comprise a DC power signal. The voltage detector can comprise a voltage scaler for scaling the output voltage of the power amplifier. The voltage scaler can comprise a voltage divider. The voltage divider can comprise a capacitive voltage divider. According to an exemplary embodiment of the first aspect, the system can include a voltage scaling ratio controller in communication with the voltage detector for controlling a voltage scaling ratio of the voltage scaler, to maintain the voltage signal within a predetermined voltage range. The voltage scaling ratio controller can set the voltage scaling ratio of the voltage scaler based upon a predetermined target output power of the power amplifier.

According to the first aspect, the current detector can comprise a current mirror for mirroring the output current of the power amplifier. The mirrored output current can be scaled using a predetermined current scaling ratio. According to the first aspect, the multiplier can comprise a linear multiplier. According to an exemplary embodiment of the first aspect, the linear multiplier can comprise a Gilbert-cell multiplier.

According to the first aspect, the power controller can generate a control signal associated with the power signal. The control signal can be configured to vary the true output power delivered by the power amplifier. The power controller can comprise a comparator for comparing the power signal with at least one predetermined threshold. The power controller can generate the control signal based upon the comparison of the power signal with the at least one predetermined threshold. According to an exemplary embodiment of the first aspect, the at least one predetermined threshold can comprise a first predetermined threshold and a second predetermined threshold. The first predetermined threshold can be greater than the second predetermined threshold. The control signal can be configured to cause the true output power of the power amplifier to decrease when the power signal exceeds the first predetermined threshold and can be configured to cause the true output power of the power amplifier to increase when the power signal is less than the second predetermined threshold. According to an alternative exemplary embodiment of the first aspect, the at least one predetermined threshold can comprise a first predetermined threshold. The control signal can be configured to cause the true output power of the power amplifier to decrease when the power signal exceeds the first predetermined threshold, and can be configured to cause the true output power of the power amplifier to increase when the power signal is less than the first predetermined threshold.

According to an exemplary embodiment of the first aspect, at least the power controller and the power amplifier can be formed on a monolithic substrate. For example, the voltage detector, the current detector and the power detector can also be formed on the monolithic substrate. According to an alternative exemplary embodiment of the first aspect, the power amplifier can comprise at least the power controller. For example, the power amplifier can further comprise the voltage detector, the current detector and the power detector. The system of the first aspect can comprise a transmitter portion of a transceiver. According to exemplary embodiments of the present invention, the system can be compliant with a standard selected from the group consisting of 802.11, 802.11a, 802.11b and 802.11g.

According to a second aspect of the present invention, a system for controlling true output power of a transmitter means comprises a voltage detector means in communication with a power amplifier means of the transmitter means for detecting an output voltage of the power amplifier means. The voltage detector means generates a voltage signal that is proportional to the output voltage of the power amplifier means. The system includes a current detector means in communication with the power amplifier means for detecting an output current of the power amplifier means. The current detector means generates a current signal that is proportional to the output current of the power amplifier means. The system includes a power detector means in communication with the voltage detector means and the current detector means for detecting a true output power delivered by the power amplifier means. The power detector means comprises a multiplier means for multiplying the current signal and the voltage signal to generate a power signal. The power signal is proportional to the true output power delivered by the power amplifier means. The system also includes a power controller means in communication with the power detector means and the power amplifier means for controlling the power amplifier means to regulate the true output power delivered by the power amplifier means based on the power signal.

According to the second aspect, the voltage signal can comprise a fundamental frequency component of the output voltage of the power amplifier means, the current signal can comprise a fundamental frequency component of the output current of the power amplifier means, and the power signal can comprise a DC power signal. The voltage detector means can comprise a voltage scaler means for scaling the output voltage of the power amplifier means. The voltage scaler means can comprise a voltage divider means. The voltage divider means can comprise a capacitive voltage divider means. According to an exemplary embodiment of the second aspect, the system can include a voltage scaling ratio controller means in communication with the voltage detector means for controlling a voltage scaling ratio of the voltage scaler means, to maintain the voltage signal within a predetermined voltage range. The voltage scaling ratio controller means can set the voltage scaling ratio of the voltage scaler means based upon a predetermined target output power of the power amplifier means.

According to the second aspect, the current detector means can comprise a current mirror means for mirroring the output current of the power amplifier means. The mirrored output current can be scaled using a predetermined current scaling ratio. According to the second aspect, the multiplier means can comprise a linear multiplier means. According to an exemplary embodiment of the second aspect, the linear multiplier means can comprise a Gilbert-cell multiplier means.

According to the second aspect, the power controller means can generate a control signal associated with the power signal. The control signal can be configured to vary the true output power delivered by the power amplifier means. The power controller means can comprise a comparator means for comparing the power signal with at least one predetermined threshold. The power controller means can generate the control signal based upon the comparison of the power signal with the at least one predetermined threshold. According to an exemplary embodiment of the second aspect, the at least one predetermined threshold can comprise a first predetermined threshold and a second predetermined threshold. The first predetermined threshold can be greater than the second predetermined threshold. The control signal can be configured to cause the true output power of the power amplifier means to decrease when the power signal exceeds the first predetermined threshold and can be configured to cause the true output power of the power amplifier means to increase when the power signal is less than the second predetermined threshold. According to an alternative exemplary embodiment of the second aspect, the at least one predetermined threshold can comprise a first predetermined threshold. The control signal can be configured to cause the true output power of the power amplifier means to decrease when the power signal exceeds the first predetermined threshold, and can be configured to cause the true output power of the power amplifier means to increase when the power signal is less than the first predetermined threshold.

According to an exemplary embodiment of the second aspect, at least the power controller means and the power amplifier means can be formed on a monolithic substrate. For example, the voltage detector means, the current detector means and the power detector means can also be formed on the monolithic substrate. According to an alternative exemplary embodiment of the second aspect, the power amplifier means can comprise at least the power controller means. For example, the power amplifier means can further comprise the voltage detector means, the current detector means and the power detector means. The system of the second aspect can comprise a transmitter portion of a transceiver means. According to exemplary embodiments of the present invention, the system can be compliant with a standard selected from the group consisting of 802.11, 802.11a, 802.11b and 802.11g.

According to a third aspect of the present invention, a method of controlling true output power of a transmitter comprises the steps of: i.) providing: a voltage detector in communication with a power amplifier of the transmitter; a current detector in communication with the power amplifier; a power detector in communication with the voltage detector and the current detector, wherein the power detector comprises a multiplier; and a power controller in communication with the power detector and the power amplifier; ii.) detecting an output voltage of the power amplifier using the voltage detector; iii.) generating a voltage signal using the voltage detector, wherein the voltage signal is proportional to the output voltage of the power amplifier; iv.) detecting an output current of the power amplifier using the current detector; v.) generating a current signal using the current detector, wherein the current signal is proportional to the output current of the power amplifier; vi.) detecting a true output power delivered by the power amplifier using the power detector, wherein the multiplier of the power detector multiplies the current signal and the voltage signal to generate a power signal that is proportional to the true output power delivered by the power amplifier; and vii.) controlling the power amplifier using the power controller to regulate the true output power delivered by the power amplifier based on the power signal.

According to the third aspect, the voltage signal can comprise a fundamental frequency component of the output voltage of the power amplifier, the current signal can comprise a fundamental frequency component of the output current of the power amplifier, and the power signal can comprise a DC power signal. For the step of detecting an output voltage, the method can comprise the steps of: viii.) providing: a voltage scaler in communication with the voltage detector; and ix.) scaling the output voltage of the power amplifier using the voltage scaler. According to the third aspect, the voltage scaler can include a voltage divider. According to an exemplary embodiment of the third aspect, the voltage divider can include a capacitive voltage divider. For the step of scaling the output voltage, the method can comprise the steps of: x.) providing: a voltage scaling ratio controller in communication with the voltage detector; and xi.) controlling a voltage scaling ratio of the voltage scaler using the voltage scaling ratio controller, to maintain the voltage signal within a predetermined voltage range. For the step of controlling the voltage scaling ratio of the voltage scaler, the method can comprise the step of: xii.) setting the voltage scaling ratio of the voltage scaler based upon a predetermined target output power of the power amplifier.

According to the third aspect, for the step of detecting an output current, the method can comprise the steps of: xiii.) providing: a current mirror in communication with the current detector; xiv.) mirroring the output current of the power amplifier using the current mirror, wherein the mirrored output current is scaled using a predetermined current scaling ratio. According to the third aspect, the multiplier can include a linear multiplier. According to an exemplary embodiment of the third aspect, the linear multiplier can include a Gilbert-cell multiplier. For the step of controlling the power amplifier, the method can comprise the steps of: xv.) generating a control signal associated with the power signal using the power controller; and xvi.) varying the true output power delivered by the power amplifier using the control signal. The step of generating the control signal can comprise the steps of: xvii.) providing: a comparator in communication with the power controller; xviii.) comparing the power signal with at least one predetermined threshold using the comparator; and xix.) generating the control signal by the power controller based upon the comparison of the power signal with the at least one predetermined threshold.

According to an exemplary embodiment of the third aspect, the at least one predetermined threshold can comprise a first predetermined threshold and a second predetermined threshold. The first predetermined threshold can be greater than the second predetermined threshold. For the step of varying, the method can comprise the steps of: xx.) decreasing the true output power of the power amplifier using the control signal, when the power signal exceeds the first predetermined threshold; and xxi.) increasing the true output power of the power amplifier using the control signal, when the power signal is less than the second predetermined threshold. According to an alternative exemplary embodiment of the third aspect, the at least one predetermined threshold can comprise a first predetermined threshold. For the step of varying, the method can comprise the steps of: xxii.) decreasing the true output power of the power amplifier, when the power signal exceeds the first predetermined threshold; and xxiii.) increasing the true output power of the power amplifier, when the power signal is less than the first predetermined threshold.

According to an exemplary embodiment of the third aspect, at least the power controller and the power amplifier can be formed on a monolithic substrate. For example, the voltage detector, the current detector and the power detector can also be formed on the monolithic substrate. According to an alternative exemplary embodiment of the third aspect, the power amplifier can comprise at least the power controller. For example, the power amplifier can further comprise the voltage detector, the current detector and the power detector. According to exemplary embodiments of the present invention, the method can be compliant with a standard selected from the group consisting of 802.11, 802.11a, 802.11b and 802.11g.

According to a fourth aspect of the present invention, a method of controlling true output power of a transmitter comprises the steps of: i.) monitoring an output voltage of a power amplifier of the transmitter; ii.) producing a voltage signal that is proportional to the output voltage of the power amplifier; iii.) monitoring an output current of the power amplifier; iv.) producing a current signal that is proportional to the output current of the power amplifier; v.) multiplying the current signal and the voltage signal to generate a power signal, wherein the power signal is proportional to a true output power delivered by the power amplifier; and vi.) controlling the power amplifier to regulate the true output power delivered by the power amplifier based on the power signal.

According to the fourth aspect, the voltage signal can comprise a fundamental frequency component of the output voltage of the power amplifier, the current signal can comprise a fundamental frequency component of the output current of the power amplifier, and the power signal can comprise a DC power signal. The step of monitoring the output voltage can comprise the step of: vii.) scaling the output voltage of the power amplifier. The step of scaling the output voltage can comprise the step of: viii.) controlling the scaling of the output voltage to maintain the voltage signal within a predetermined voltage range. The step of controlling the scaling of the output voltage can comprise the step of: ix.) setting the scaling of the output voltage based upon a predetermined target output power of the power amplifier. The step of monitoring an output current can comprise the step of: x.) mirroring the output current of the power amplifier, wherein the mirrored output current can be scaled using a predetermined current scaling ratio.

According to the fourth aspect, for the step of controlling the power amplifier, the method can comprise the steps of: xi.) generating a control signal associated with the power signal; and xii.) varying the true output power delivered by the power amplifier using the control signal. The step of generating the control signal can comprise the step of: xiii.) comparing the power signal with at least one predetermined threshold, wherein the control signal is generated based upon the comparison of the power signal with the at least one predetermined threshold. According to an exemplary embodiment of the fourth aspect, the at least one predetermined threshold can comprise a first predetermined threshold and a second predetermined threshold. The first predetermined threshold can be greater than the second predetermined threshold. For the step of varying, the method can comprise the steps of: xiv.) decreasing the true output power of the power amplifier using the control signal, when the power signal exceeds the first predetermined threshold; and xv.) increasing the true output power of the power amplifier using the control signal, when the power signal is less than the second predetermined threshold. According to an alternative exemplary embodiment of the fourth aspect, the at least one predetermined threshold can comprise a first predetermined threshold. For the step of varying, the method can comprise the steps of: xvi.) decreasing the true output power of the power amplifier, when the power signal exceeds the first predetermined threshold; and xvii.) increasing the true output power of the power amplifier, when the power signal is less than the first predetermined threshold. According to exemplary embodiments of the present invention, the method can be compliant with a standard selected from the group consisting of 802.11, 802.11a, 802.11b and 802.11g.

According to a fifth aspect of the present invention, a system for controlling true output power of a transmitter includes means for monitoring an output voltage of a power amplifier of the transmitter. The system includes means for producing a voltage signal that is proportional to the output voltage of the power amplifier. The system includes means for monitoring an output current of the power amplifier. The system includes means for producing a current signal that is proportional to the output current of the power amplifier. The system includes means for multiplying the current signal and the voltage signal to generate a power signal, wherein the power signal is proportional to a true output power delivered by the power amplifier. The system also includes means for controlling the power amplifier to regulate the true output power delivered by the power amplifier based on the power signal.

According to the fifth aspect, the voltage signal can comprise a fundamental frequency component of the output voltage of the power amplifier, the current signal can comprise a fundamental frequency component of the output current of the power amplifier, and the power signal can comprise a DC power signal. The means for monitoring the output voltage can comprise means for scaling the output voltage of the power amplifier. The means for scaling the output voltage can comprise means for controlling the scaling of the output voltage to maintain the voltage signal within a predetermined voltage range. The means for controlling the scaling of the output voltage can comprise means for setting the scaling of the output voltage based upon a predetermined target output power of the power amplifier. The means for monitoring an output current can comprise means for mirroring the output current of the power amplifier, wherein the mirrored output current can be scaled using a predetermined current scaling ratio. The means for controlling the power amplifier can comprise means for generating a control signal associated with the power signal, and means for varying the true output power delivered by the power amplifier using the control signal.

According to the fifth aspect, the means for generating the control signal can comprise means for comparing the power signal with at least one predetermined threshold. The means for generating the control signal can generate the control signal based upon the comparison of the power signal with the at least one predetermined threshold. According to an exemplary embodiment of the fifth aspect, the at least one predetermined threshold can comprise a first predetermined threshold and a second predetermined threshold, wherein the first predetermined threshold is greater than the second predetermined threshold. The means for varying can comprise means for decreasing the true output power of the power amplifier using the control signal, when the power signal exceeds the first predetermined threshold, and means for increasing the true output power of the power amplifier using the control signal, when the power signal is less than the second predetermined threshold. According to an alternative exemplary embodiment of the fifth aspect, the at least one predetermined threshold can comprise a first predetermined threshold. The means for varying can comprise means for decreasing the true output power of the power amplifier using the control signal, when the power signal exceeds the first predetermined threshold, and means for increasing the true output power of the power amplifier using the control signal, when the power signal is less than the first predetermined threshold.

According to the fifth aspect, at least the means for controlling the power amplifier and the power amplifier can be formed on a monolithic substrate. The means for monitoring the output voltage, the means for producing the voltage signal, the means for monitoring the output current, the means for producing the current signal and the means for multiplying can be formed on the monolithic substrate. The power amplifier can comprise at least the means for controlling the power amplifier. The power amplifier can further comprise the means for monitoring the output voltage, the means for producing the voltage signal, the means for monitoring the output current, the means for producing the current signal and the means for multiplying. The system can comprise a transmitter portion of a transceiver means. According to exemplary embodiments, the system can be compliant with a standard selected from the group consisting of 802.11, 802.11a, 802.11b and 802.11g.

According to a sixth aspect of the present invention, a computer program for controlling true output power of a transmitter by performing the steps of: i.) monitoring an output voltage of a power amplifier of the transmitter; ii.) producing a voltage signal that is proportional to the output voltage of the power amplifier; iii.) monitoring an output current of the power amplifier; iv.) producing a current signal that is proportional to the output current of the power amplifier; v.) multiplying the current signal and the voltage signal to generate a power signal, wherein the power signal is proportional to a true output power delivered by the power amplifier; and vi.) controlling the power amplifier to regulate the true output power delivered by the power amplifier based on the power signal.

According to the sixth aspect, the voltage signal can comprise a fundamental frequency component of the output voltage of the power amplifier, the current signal can comprise a fundamental frequency component of the output current of the power amplifier, and the power signal can comprise a DC power signal. For the step of monitoring the output voltage, the computer program can perform the step of: vii.) controlling the scaling of the output voltage to maintain the voltage signal within a predetermined voltage range. For the step of controlling the scaling of the output voltage, the computer program can perform the step of: viii.) setting the scaling of the output voltage based upon a predetermined target output power of the power amplifier. For the step of monitoring an output current, the computer program can perform the step of: ix.) mirroring the output current of the power amplifier, wherein the mirrored output current is scaled using a predetermined current scaling ratio.

According to the sixth aspect, for the step of controlling the power amplifier, the computer program can perform the steps of: x.) generating a control signal associated with the power signal; and xi.) varying the true output power delivered by the power amplifier using the control signal. For the step of generating the control signal, the computer program can perform the step of: xii.) comparing the power signal with at least one predetermined threshold, wherein the control signal is generated based on a comparison of the power signal with the at least one predetermined threshold. According to an exemplary embodiment of the sixth aspect, the at least one predetermined threshold can comprise a first predetermined threshold and a second predetermined threshold, wherein the first predetermined threshold is greater than the second predetermined threshold. For the step of varying, the computer program can perform the steps of: xiii.) decreasing the true output power of the power amplifier using the control signal, when the power signal exceeds the first predetermined threshold; and xiv.) increasing the true output power of the power amplifier using the control signal, when the power signal is less than the second predetermined threshold. According to an alternative exemplary embodiment of the sixth aspect, the at least one predetermined threshold can comprise a first predetermined threshold. For the step of varying, the computer program can perform the steps of: xv.) decreasing the true output power of the power amplifier using the control signal, when the power signal exceeds the first predetermined threshold; and xvi.) increasing the true output power of the power amplifier using the control signal, when the power signal is less than the first predetermined threshold.

According to a seventh aspect of the present invention, a system for controlling true output power of a transmitter includes a voltage detector in communication with a power amplifier of the transmitter for detecting an output voltage of the power amplifier. The voltage detector generates a voltage signal that is proportional to the output voltage of the power amplifier. The voltage detector includes a voltage scaler for scaling the output voltage of the power amplifier, and a voltage scaling ratio controller for controlling a voltage scaling ratio of the voltage scaler to maintain the voltage signal within a predetermined voltage range. The system includes a current detector in communication with the power amplifier for detecting an output current of the power amplifier. The current detector generates a current signal that is proportional to the output current of the power amplifier. The current detector includes a current mirror for mirroring the output current of the power amplifier, wherein the mirrored output current can be scaled using a predetermined current scaling ratio. The system includes a power detector in communication with the voltage detector and the current detector for detecting a true output power delivered by the power amplifier. The power detector comprises a multiplier for multiplying the current signal and the voltage signal to generate a power signal. The power signal is proportional to the true output power delivered by the power amplifier. The system includes a power controller in communication with the power detector and the power amplifier for controlling the power amplifier to regulate the true output power delivered by the power amplifier based on the power signal. The power controller generates a control signal associated with the power signal. The control signal is configured to vary the true output power delivered by the power amplifier. The power controller includes a comparator for comparing the power signal with at least one predetermined threshold. The power controller generates the control signal based upon the comparison of the power signal with the at least one predetermined threshold.

According to the seventh aspect, the voltage signal can comprise a fundamental frequency component of the output voltage of the power amplifier, the current signal can comprise a fundamental frequency component of the output current of the power amplifier, and the power signal can comprise a DC power signal. The voltage scaler can comprise a voltage divider. The voltage divider can comprise a capacitive voltage divider. The voltage scaling ratio controller can set the voltage scaling ratio of the voltage scaler based upon a predetermined target output power of the power amplifier. According to an exemplary embodiment of the seventh aspect, the at least one predetermined threshold can comprise a first predetermined threshold and a second predetermined threshold, wherein the first predetermined threshold is greater than the second predetermined threshold. The control signal can be configured to cause the true output power of the power amplifier to decrease when the power signal exceeds the first predetermined threshold and can be configured to cause the true output power of the power amplifier to increase when the power signal is less than the second predetermined threshold. According to an alternative exemplary embodiment of the seventh aspect, the at least one predetermined threshold can comprise a first predetermined threshold. The control signal can be configured to cause the true output power of the power amplifier to decrease when the power signal exceeds the first predetermined threshold and can be configured to cause the true output power of the power amplifier to increase when the power signal is less than the first predetermined threshold.

According to the seventh aspect, the multiplier can comprise a linear multiplier. According to an exemplary embodiment of the seventh aspect, the linear multiplier can comprise a Gilbert-cell multiplier. At least the power controller and the power amplifier can be formed on a monolithic substrate. The voltage detector, the current detector and the power detector can be formed on the monolithic substrate. The power amplifier can comprise at least the power controller. The power amplifier can further comprise the voltage detector, the current detector and the power detector. The system can comprise a transmitter portion of a transceiver. According to exemplary embodiments, the system can be compliant with a standard selected from the group consisting of 802.11, 802.11a, 802.11b and 802.11g.

According to an eighth aspect of the present invention, a system for controlling true output power of a transmitter includes a voltage detector means in communication with a power amplifier of the transmitter for detecting an output voltage of the power amplifier. The voltage detector means generates a voltage signal that is proportional to the output voltage of the power amplifier. The voltage detector means includes a voltage scaler means for scaling the output voltage of the power amplifier, and a voltage scaling ratio controller means for controlling a voltage scaling ratio of the voltage scaler means to maintain the voltage signal within a predetermined voltage range. The system includes a current detector means in communication with the power amplifier for detecting an output current of the power amplifier. The current detector means generates a current signal that is proportional to the output current of the power amplifier. The current detector means includes a current mirror means for mirroring the output current of the power amplifier, wherein the mirrored output current can be scaled using a predetermined current scaling ratio. The system includes a power detector means in communication with the voltage detector means and the current detector means for detecting a true output power delivered by the power amplifier. The power detector means comprises a multiplier means for multiplying the current signal and the voltage signal to generate a power signal. The power signal is proportional to the true output power delivered by the power amplifier. The system includes a power controller means in communication with the power detector means and the power amplifier for controlling the power amplifier to regulate the true output power delivered by the power amplifier based on the power signal. The power controller means generates a control signal associated with the power signal. The control signal is configured to vary the true output power delivered by the power amplifier. The power controller means includes a comparator means for comparing the power signal with at least one predetermined threshold. The power controller means generates the control signal based upon the comparison of the power signal with the at least one predetermined threshold.

According to the eighth aspect, the voltage signal can comprise a fundamental frequency component of the output voltage of the power amplifier, the current signal can comprise a fundamental frequency component of the output current of the power amplifier, and the power signal can comprise a DC power signal. The voltage scaler means can comprise a voltage divider means. The voltage divider means can comprise a capacitive voltage divider means. The voltage scaling ratio controller means can set the voltage scaling ratio of the voltage scaler means based upon a predetermined target output power of the power amplifier. According to an exemplary embodiment of the eighth aspect, the at least one predetermined threshold can comprise a first predetermined threshold and a second predetermined threshold, wherein the first predetermined threshold is greater than the second predetermined threshold. The control signal can be configured to cause the true output power of the power amplifier to decrease when the power signal exceeds the first predetermined threshold and can be configured to cause the true output power of the power amplifier to increase when the power signal is less than the second predetermined threshold. According to an alternative exemplary embodiment of the eighth aspect, the at least one predetermined threshold can comprise a first predetermined threshold. The control signal can be configured to cause the true output power of the power amplifier to decrease when the power signal exceeds the first predetermined threshold and can be configured to cause the true output power of the power amplifier to increase when the power signal is less than the first predetermined threshold.

According to the eighth aspect, the multiplier means can comprise a linear multiplier means. According to an exemplary embodiment of the eighth aspect, the linear multiplier means can comprise a Gilbert-cell multiplier means. At least the power controller means and the power amplifier can be formed on a monolithic substrate. The voltage detector means, the current detector means and the power detector means can be formed on the monolithic substrate. The power amplifier can comprise at least the power controller means. The power amplifier can further comprise the voltage detector means, the current detector means and the power detector means. The system can comprise a transmitter portion of a transceiver means. According to exemplary embodiments, the system can be compliant with a standard selected from the group consisting of 802.11, 802.11a, 802.11b and 802.11g.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a system and method for controlling true output power of a transmitter. According exemplary embodiments, a true power detector is used to measure the true transmitted power of a transmitter by sensing the product of the current and voltage delivered by a power amplifier of the transmitter. The power detector can use, for example, a Gilbert-cell multiplier or other multiplier to multiply a scaled version of the output voltage of the power amplifier and a mirrored and scaled version of the output current through the power amplifier. The resulting product—a power signal representative of the true transmitted power—can then be used to regulate or otherwise vary the true output power of the power amplifier to control the true output power of the power amplifier and, hence, the transmitter. Unlike voltage-sensing detectors, exemplary embodiments of the present invention can provide greater than 0.5 dB accuracy in measured output power over variations of the impedances of the components and the antenna, thereby improving the precision of control of the true output power of the power amplifier.

As used herein, "true output power" refers to the true power delivered by a source to a load such as, for example, an antenna. As used herein, true power is expressed as the product of the output voltage and the output current of the source.

Figure 1:
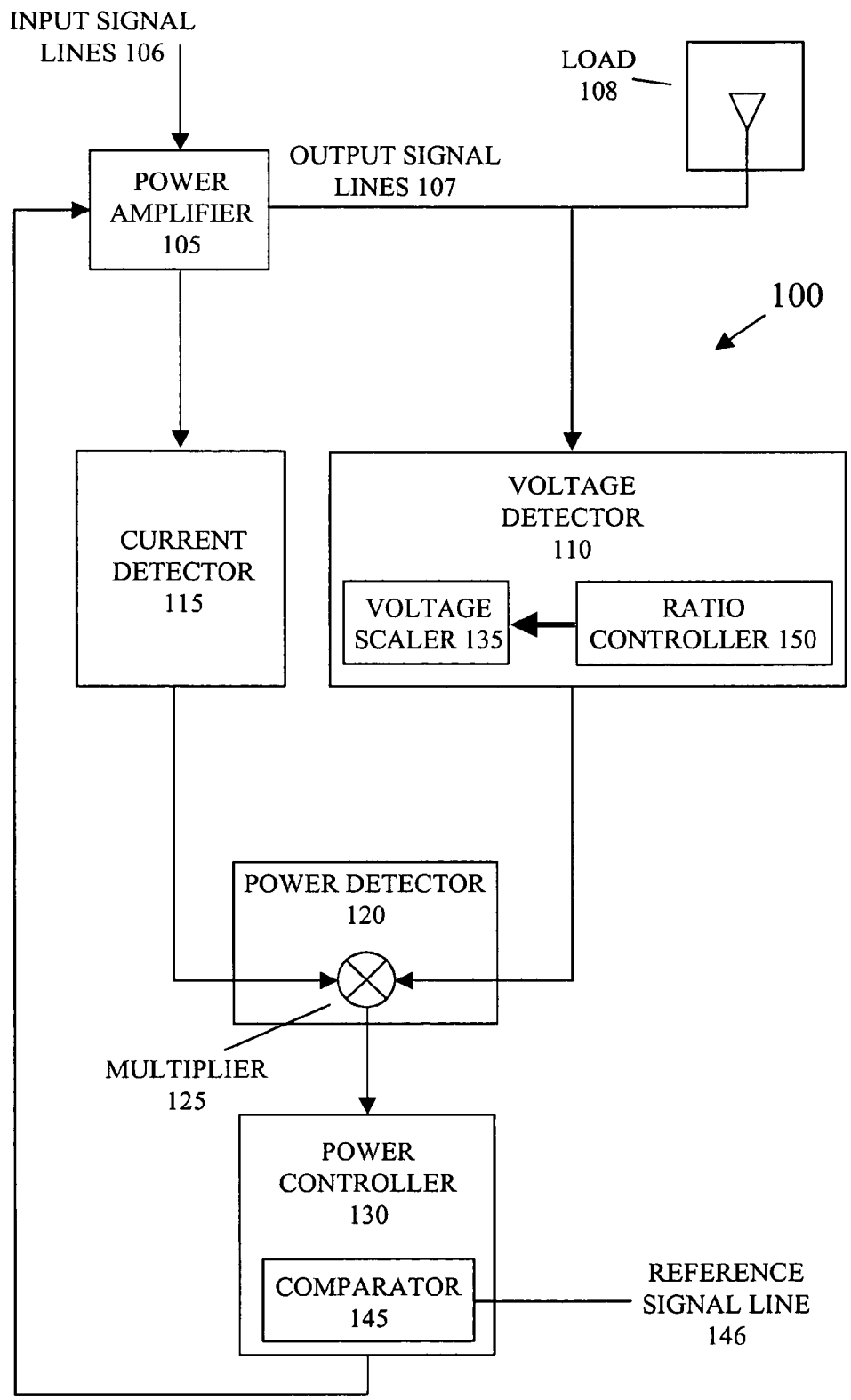
FIG. 1 is a diagram illustrating a system for controlling true output power of a transmitter, in accordance with an exemplary embodiment of the present invention.

These and other aspects of the present invention will now be described in greater detail. FIG. 1 is a diagram illustrating a system 100 for controlling true output power of a transmitter, in accordance with an exemplary embodiment of the present invention. The system 100 can include a voltage detector 110 in communication with a power amplifier 105 of the transmitter for detecting an output voltage of the power amplifier 105. The power amplifier 105 can be any type of power amplifier or other amplifier that is capable of amplifying any type of electrical signal, for example, for transmission either wirelessly or wired. The input(s) to power amplifier 105 can be connected directly or indirectly to any other electrical or electronic components of the transmitter using one or more input signal lines 106. The input signal lines 106 can be any type of electrical connection capable of communicating electrical information. Thus, other electrical or electronic components of the transmitter can supply the power amplifier 105 with the electrical signal(s) for amplification using input signal lines 106. The output of power amplifier 105 can be connected to a load 108, such as an antenna(s) or any other type of load, using output signal lines 107. The output signal lines 107 can be any type of electrical connection capable of communicating electrical information. Other input/output connections can also be made to/from power amplifier 105, such as a connection to a power supply and the like, as necessary.

The voltage detector 110 can be any type of voltage detector that is capable of monitoring, sampling or otherwise detecting a voltage signal that is output by the power amplifier 105. For example, the voltage detector 110 can be any type of electrical circuitry, combination of electrical components or the like configured to detect the output voltage of the power amplifier 105. According to exemplary embodiments, the voltage detector 110 can generate a voltage signal that is proportional to the output voltage of the power amplifier 105. According to an exemplary embodiment, the voltage detector 110 can comprise a voltage scaler 135 for scaling the output voltage of the power amplifier 105. The voltage scaler 135 can be any type of electrical circuitry, combination of electrical components, or the like configured to scale down or otherwise reduce the amplitude of the output voltage of the power amplifier 105. For example, the voltage scaler 135 can comprise a voltage divider. According to an exemplary embodiment, the voltage divider can be a capacitive voltage divider. The amplitude of the output voltage of the power amplifier 105 can be scaled down or otherwise reduced upon detection to, for example, maintain the linearity of the operation of the components of system 100.

The voltage detector 110 can be located either externally or internally to the power amplifier 105. If located externally, the voltage detector 110 can be connected to power amplifier 105 (e.g., at the output or any other appropriate location of the power amplifier 105) using any type of electrical connection capable of communicating electrical information. If located internally, the voltage detector 110 can form a portion of the power amplifier 105.

The system 100 can include a current detector 115 in communication with the power amplifier 105 for detecting an output current of the power amplifier 105. The current detector 115 can be any type of current detector that is capable of monitoring, sampling or otherwise detecting a current signal that is output by the power amplifier 105. For example, the current detector 115 can be any type of electrical circuitry, combination of electrical components or the like configured to detect the output current of the power amplifier 105. According to exemplary embodiments, the current detector 110 can generate a current signal that is proportional to the output current of the power amplifier. According to an exemplary embodiment, the current detector 115 can comprise a current mirror for mirroring the output current of the power amplifier 105. The current mirror can be any type of electrical circuitry, combination of electrical components or the like configured to mirror the output current of the power amplifier 105. According to an exemplary embodiment, the mirrored output current can be scaled using a predetermined current scaling ratio. The predetermined current scaling ratio can be any value that can scale down or otherwise reduce the amplitude of the output current of the power amplifier 105 to, for example, maintain the linearity of the operation of the components of system 100.

The current detector 115 can be located either externally or internally to the power amplifier 105. If located externally, the current detector 115 can be connected to power amplifier 105 (e.g., at the output or any other appropriate location of the power amplifier 105) using any type of electrical connection capable of communicating electrical information. If located internally, the current detector 115 can form a portion of the power amplifier 105.

The system 100 can include a power detector 120 in communication with the voltage detector 110 and the current detector 115 for detecting a true output power delivered by the power amplifier 105. According to exemplary embodiments, the power detector 120 can comprise a multiplier 125 for multiplying the current signal and the voltage signal to generate a power signal. For example, the multiplier 125 can be a linear multiplier. According to an exemplary embodiment, the linear multiplier can be a Gilbert-cell multiplier. However, power detector 120 can be any type of electrical circuitry, combination of electrical components or the like that is capable of generating a power signal through the multiplication of the voltage signal and current signal from the voltage detector 110 and current detector 115, respectively. According to exemplary embodiments, the voltage signal can comprise the fundamental frequency component of the output voltage of the power amplifier 105, the current signal can comprise the fundamental frequency component of the output current of the power amplifier 105, and the power signal can comprise a DC power signal. The resulting power signal is proportional to the true output power delivered by the power amplifier 105.

The power detector 120 can be located either externally or internally to the power amplifier 105. If located externally, the power detector 120 can be connected to the voltage detector 110 and the current detector 115 using any type of electrical connection capable of communicating electrical information. If located internally, the power detector 120 can form a portion of the power amplifier 105.

The system 100 can include a power controller 130 in communication with the power detector 120 and power amplifier 105 for controlling the power amplifier 105 to regulate the true output power delivered by the power amplifier 105 based on the power signal generated by the power detector 120. According to exemplary embodiments, the power controller 120 can generate a control signal associated with the power signal. The control signal can be configured to vary the true output power delivered by the power amplifier 105. According to an exemplary embodiment, the power controller 130 can include a comparator 145 for comparing the power signal with at least one predetermined threshold. The comparator 145 can be any type of electrical circuitry, combination of electrical components or the like capable of comparing a first signal with a reference signal and generating a separate signal indicative of, for example, the difference between the first signal and the reference signal, or whether the first signal is less than, equal to, or greater than the predetermined threshold. Alternatively, the comparator 145 can be a differential comparator capable of comparing a differential (positive and negative) signal to a differential reference signal.

According to an exemplary embodiment of the present invention, the at least one predetermined threshold can comprise a first predetermined threshold and a second predetermined threshold. The first predetermined threshold can be greater than the second predetermined threshold, so as to specify high and low threshold values, respectively. Accordingly, the control signal can be configured to cause the true output power of the power amplifier 105 to decrease when the power signal exceeds the first predetermined threshold and can be configured to cause the true output power of the power amplifier 105 to increase when the power signal is less than the second predetermined threshold. For purposes of illustration and not limitation, for a target true output power of 15 dBm, the first predetermined threshold can be set at 15.5 dBm and the second predetermined threshold can be set at 14.5 dBm. Exemplary embodiments of the present invention can decrease the true output power of the power amplifier 105 if the power signal exceeds 15.5 dBm and increase the true output power of the power amplifier 105 if the power signal is less than 14.5 dBm, so as to maintain the true output power of the power amplifier 105 within a range around the target output power of 15 dBm. Other values for the predetermined thresholds can be used.

According to an alternative exemplary embodiment of the present invention, the at least one predetermined threshold can comprise a first predetermined threshold. Accordingly, the control signal can be configured to cause the true output power of the power amplifier 105 to decrease when the power signal exceeds the first predetermined threshold and can be configured to cause the true output power of the power amplifier 105 to increase when the power signal is less than the first predetermined threshold. The predetermined thresholds can be, for example, predetermined power signal amplitude levels or any other type of reference values or signals that can be supplied to comparator 145 along, for example, reference signal line 146. For example, the predetermined thresholds can be stored in any type of computer memory, retrieved, converted to analog form (e.g., by means of a digital-to-analog converter) and passed to comparator 145 for use in comparison. Alternatively, the predetermined thresholds can be an analog signals supplied by a signal generator via reference signal line 146. However, the predetermined thresholds can be any type of signals or information and of any value, depending on the desired true output power operating level and characteristics of power amplifier 105.

The power controller 130 can generate the control signal based upon the comparison of the power signal with the at least one predetermined threshold performed by the comparator 145. For example, for a single predetermined threshold of the alternative exemplary embodiment of the present invention, the power controller 130 can generate a control signal, such as an error signal or other signal, that can represent the difference between the power signal and the first predetermined threshold. For example, the control signal can be negative when the power signal is less than the first predetermined threshold (causing a decrease in the true output power of the power amplifier 105) and positive when the power signal exceeds the predetermined threshold (causing an increase in the true output power of the power amplifier 105). According to either exemplary embodiment, the control signal can be any type of signal that can cause the true output of the power amplifier 105 to decrease when the power signal exceeds the first predetermined threshold and that can cause the true output power of the power amplifier 105 to increase when the power signal is less than the first (or second) predetermined threshold.

According to an exemplary embodiment of the present invention, the power controller 130 can use the control signal to control, for example, the gain control voltage of the power amplifier 105, or any other control or input signal to the power amplifier 105 that can be used to control the true output power of the power amplifier 105. For example, if the power signal exceeds the first predetermined threshold, the power controller 130 can use the control signal to reduce or cause a reduction in the gain control voltage of the power amplifier 105 to reduce the true output power level by the amount the power signal exceeds the first predetermined threshold. Alternatively, if the power signal is less than the first (or second) predetermined voltage, the power controller 130 can use the control signal to increase or cause an increase in the gain control voltage of the power amplifier 105 to increase the true output power level by the amount the power signal is less than the first (or second) predetermined threshold. If the power signal and the first predetermined threshold are substantially equal or the power signal is between the first and second predetermined thresholds, no alteration of the gain control voltage need be made. Thus, according to an exemplary embodiment, the true output power of the power amplifier 105 can be controlled by varying the predetermined threshold(s), with the power controller 130 altering or causing the alteration of the gain control voltage of the power amplifier 105 to modify the true output power of the power amplifier 105 until the power signal is substantially equal to or within the range of the predetermined threshold(s).

The power controller 130 can be located either externally or internally to the power amplifier 105. If located externally, the power controller 130 can be connected to power amplifier 105 (e.g., at an appropriate input control line of the power amplifier 105) using any type of electrical connection capable of communicating electrical information. If located internally, the power controller 130 can form a portion of the power amplifier 105.

According to exemplary embodiments, the system 100 can include a voltage scaling ratio controller 150 in communication with the voltage detector 110 for controlling a voltage scaling ratio of the voltage scaler, to maintain the voltage signal within a predetermined voltage range. The voltage scaling ratio controller 150 can be any type of electrical circuitry, combination of electrical components or the like capable of setting the voltage scaling ratio of the voltage scaler 135. For example, the voltage scaling ratio controller 150 can be comprised of any type of processor and computer memory. The voltage scaling ratio controller 150 can set the voltage scaling ratio of the voltage scaler 135 based upon a predetermined target output power of the power amplifier 105. For example, the system 100 can have a plurality of associated target output power levels, such as, for example, 0 dBm to 20 dBm, in steps of 1 dBm, or any other range of target output power levels. Each target output power level can be associated with a different voltage scaling ratio. The target output power levels and associated voltage scaling ratios can be maintained, for example, in the computer memory (e.g., as a table or other computer database) that can comprise voltage scaling ratio controller 150 or that can be connected to voltage scaling ratio controller 150 using any type of electrical connection capable of communicating electrical information. For a given target output power, the voltage scaler 135 can be set with the voltage scaling ratio associated with the given target output power. For example, the voltage scaler 135 can be set using a multi-bit digital signal provided by the voltage scaling ratio controller 150. The multi-bit digital signal can provide for multiple voltage scaling ratios. With different voltage scaling ratios for different target output power levels, the voltage scaling ratio of the voltage scaler 135 can be changed to accommodate different target output power levels of the system 100 to maintain the linearity of the operation of the components of system 100.

The voltage division ratio controller 150 can be located either externally or internally to the voltage detector 110. If located externally, the voltage division ratio controller 150 can be connected to voltage detector 110 using any type of electrical connection capable of communicating electrical information. Alternatively, the voltage division ratio controller 150 can form a portion of the voltage detector 110.

According to an exemplary embodiment, any combination of or all of the components of system 100, including, for example, power amplifier 105, voltage detector 110, current detector 115, power detector 120 and power controller 130, can be formed on a monolithic substrate. According to another exemplary embodiment, the power amplifier 105 can be comprised of any combination of or all of voltage detector 110, current detector 115, power detector 120 and power controller 130.

The system 100, along with other components necessary for transmitting electrical signals, can be used as a stand-alone transmitter, or as the transmitter portion of a transceiver. Those of ordinary skill will recognize that the system 100 can include any additional components that can be used for receiving and transmitting information signals, including mixers, local oscillators, demodulators, modulators, automatic gain controls, phase locked loops, filters, additional power amplifiers, power supplies or any other components in any combination that can be used for receiving and transmitting information signals, depending upon the nature and type of information signals to be communicated and the environment in which the system 100 is to be used. The system 100 can be connected to additional components, such as, for example, any type of processor, including any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM) or the like. The system 100 can also be connected to any type of computer memory or any other type of electronic storage medium that is located either internally or externally to the processor such as, for example, read-only memory (ROM), random access memory (RAM), cache memory, compact disc read-only memory (CDROM), electro-optical memory, magneto-optical memory, or the like. The processor and memory can be used, for example, for performing pre-processing on transmitted information signals prior to being transmitted by transmitter, or for controlling any part of the system 100.

According to exemplary embodiments, the system 100 can be compliant with, for example, any wireless communication or networking standards, such as the family of specifications for wireless local area networks, such as 802.11, 802.11a, 802.11b, and 802.11g, or any other wireless or wired communication standards.

Figure 2:
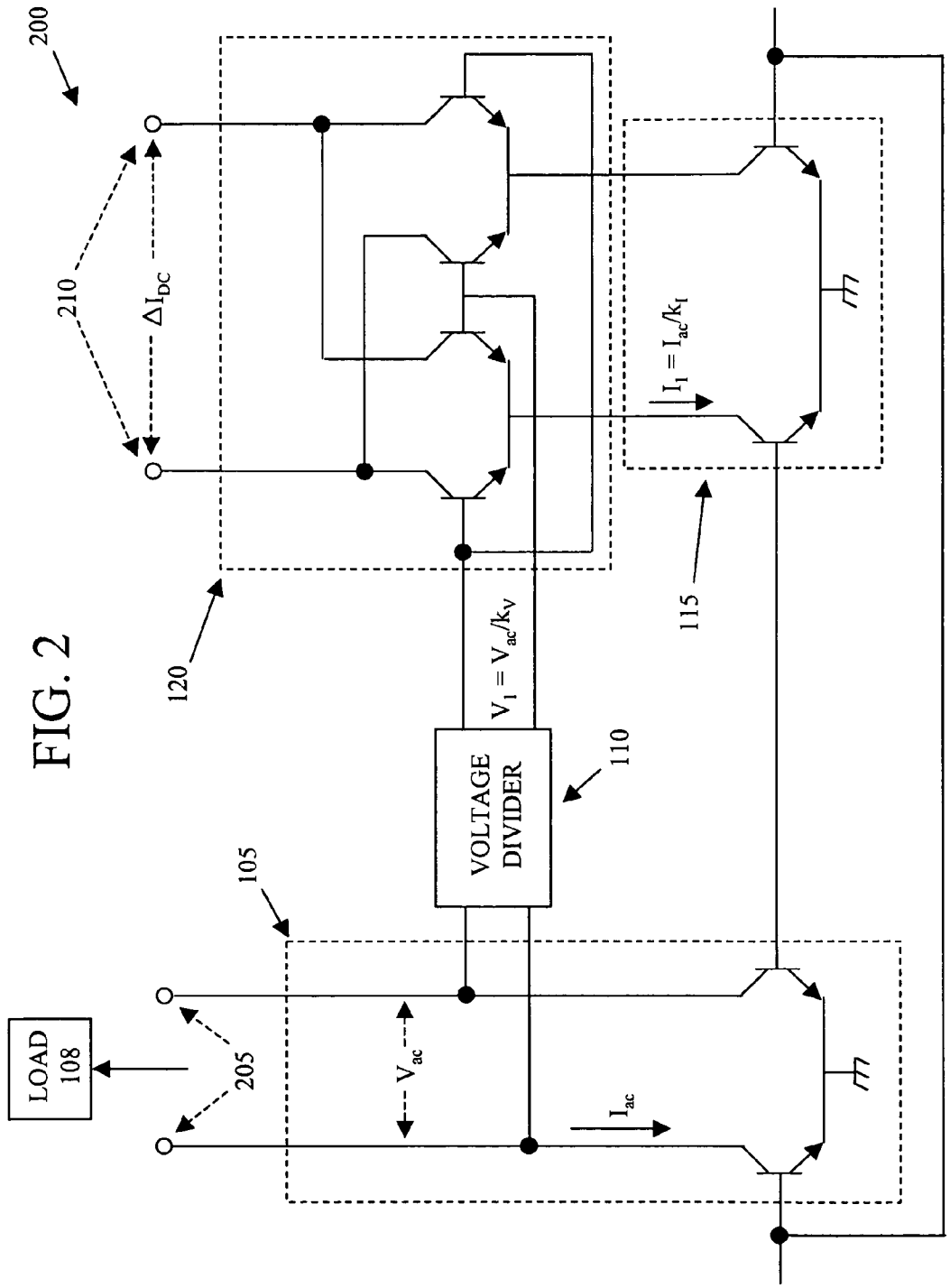
FIG. 2 is a diagram illustrating a system for controlling true output power of a transmitter, in accordance with an exemplary embodiment of the present invention.

For purposes of illustration and not limitation, FIG. 2 is a diagram illustrating a system 200 for controlling true output power of a transmitter, in accordance with an exemplary embodiment of the present invention. In system 200, the power amplifier 105 can be a bipolar output transistor for a radio frequency (RF) amplifier. The power amplifier 105 can be connected to the load 108, such as an antenna or other load, at output connection 205. The voltage detector 110 can be connected differentially across the power amplifier 105, for example, to the positive and negative side collectors of the output of the power amplifier 105. The voltage detector 110 can comprise a programmable capacitive voltage divider to divide or otherwise scale down the differential voltage. According to an exemplary embodiment, a fully differential capacitive voltage divider can be comprised of any number of series capacitors and any number of series and shunt capacitors that can be controlled by series switches. According to an exemplary embodiment, three such switches can be used, although any number and type of switches can be used. A 3-bit digital control signal can program the three series switches to provide, for example, eight different division ratios. The 3-bit control signal can be provided by, for example, voltage scaling ratio controller 150 of FIG. 1. Alternatively, the 3-bit control signal can be provided by an external controlling processor in communication with the voltage detector 110, and can be saved in and retrieved from, for example, a table or other database in computer memory. However, the control signal can be comprised of any number of bits, depending on the desired number of different division ratios.

Although any number and type of switches can be used, in choosing the sizing of the series switches, each of the switches should be large enough so that its on-resistance is relatively small (e.g., one-tenth or any appropriate value) compared to the impedance of the branch capacitance at the RF frequency of operation (e.g., 2.45 GHz according to an exemplary embodiment, although any frequency can be used). However, the drain-source parasitic capacitance should be much smaller than the branch capacitance to have an effective high impedance when the switch is off, which can impose an upper limit on the switch size. According to exemplary embodiments, although the capacitances in the capacitive voltage divider can be of any value, the capacitances should be chosen so as to minimize capacitive loading on the power amplifier 105. According to exemplary embodiments, the scaled collector voltages can be buffered through emitter-follower stages and biased through the common voltage divider to minimize the differential offset introduced to the scaled signal.

The current detector 115 can be comprised of a current mirror that mirrors the output current of the power amplifier 105 with, for example, a 1/200 ratio, although any current scaling ratio can be used. According to an exemplary embodiment, a scaled version of the power amplifier 105 ballast resistors, which can be made from a series-parallel combination of the same units as those in the power amplifier 105, can be used to obtain an accurate current mirroring ratio, as errors in the current mirror ratio can translate to errors in the detected output power.

The power detector 120 can be comprised of a double-balanced Gilbert-cell multiplier. The Gilbert-cell multiplier can be driven by the scaled-down and buffered detected collector voltage, and the mirrored current can be steered to the upper double-balanced pairs. For the Gilbert-cell multiplier to operate as a multiplier rather than a mixer, the voltage driving the Gilbert-cell multiplier can be limited to a voltage range of, for example, approximately 100 mV to approximately 200 mV, so as not to desensitize the Gilbert-cell to voltage values. However, any voltage range can be used, depending on the characteristics of the Gilbert-cell used and the application. According to an exemplary embodiment, limiting the voltage can be achieved by changing the scaling ratio of the voltage scaler of voltage detector 110 by means of the 3-bit control signal for different power levels (and, hence, different power amplifier collector voltages).

If $k_v$ and $k_I$ are the voltage and current scaling ratios, respectively, $V_{ac}$ and $I_{ac}$ are the amplitude of the fundamental components of the power amplifier collector voltage and current on each side, respectively, and $GM_1$ is the effective large signal transconductance of the Gilbert-cell multiplier, then the differential DC output current at the output 210 of the multiplier is given by Equation (1) as follows:

$$\Delta I_{DC} = GM_1 \cdot \frac{V_{ac}}{k_v} \cdot \frac{I_{ac}}{k_I} \quad (1)$$

Equation (1) illustrates that the differential DC output current is proportional to the current and voltage product, or true power delivered by the power amplifier 105. The multiplication of the fundamental components of the current and voltage generate a component at DC. The output voltage and current signals of the power amplifier 105 can also contain higher harmonics that can be mixed together. For example, mixing the second harmonic voltage and current or the third harmonic voltage and current can generate components at DC, which can create errors in detecting the power contained in the fundamental components. However, any such error will be negligible and not adversely effect the resulting true power measurement, especially since the amplitude of both mixing voltage and current are small relative to the fundamental components.

With regard to Equation (1), the transconductance of the multiplier transistor should be constant for a given power (i.e., not for all power levels, but for a given power if the V/I ratio changes). With small signals, this transconductance can be equal to the bias current of the power amplifier 105 divided by $k_I$ over VT. Hence, for a fixed power amplifier bias current, the transconductance can have 1/T dependence. For example, for larger power levels (e.g., 5-25 dBm), a semi-mixer operation occurs, where the temperature dependence is very minor. Furthermore, the average DC current drawn by power amplifier 105 can change drastically from bias level at higher power levels. The bias current can stay constant for a given output power, assuming that the power amplifier efficiency remains approximately the same if load mismatch causes a different V/I ratio, for example, as long as the mismatch is not too drastic (e.g., a 2:1 load mismatch).

According to Equation (1), the power detector 120 can generate a distinct differential current, for any given output power, that is proportional to the true output power delivered by the power amplifier 105. To provide the feedback to control the true output power (e.g., by power controller 130 connected to output 210), this analog signal can be compared with a reference. According to an exemplary embodiment, the differential current can be run through pull-up resistors to convert the detected differential current signal to a differential voltage. On a monolithic substrate, very wide poly resistors can be use to minimize mismatch and, hence, the offset introduced by the conversion. For example, to achieve a 0.5 dB resolution on the lower end of the detected power range, the converted voltage should be accurate to within approximately 10 mV, which can set an upper limit on the offset of the subsequent ranges. In addition to the offset limitation, the converted voltage can have a large common-mode voltage variation. The power amplifier current can change by an order of magnitude from bias to a much larger current at maximum power, which can also change the mirrored current in the Gilbert-cell multiplier, and which can directly translate to common-mode voltage changes in the voltage across the pull-up resistors.

To compare the differential voltage with a reference signal, a comparator (e.g., comparator 145) can be used. However, some amplification of the differential voltage signal may be necessary to overcome inherent comparator offset, even with an offset-canceling comparator. Since, according to an exemplary embodiment, the maximum differential voltage could be as high as 1 V, the subsequent gain should be limited. For example, amplification with a gain of two can be used to relax the offset requirement to, for example, approximately 20 mV, while keeping the maximum differential voltage below approximately 2V. Although a rail-to-rail amplifier input stage, such as a complimentary PMOS-NMOS pair input folded cascode, could accommodate the large common mode variation, a precise gain of two can be accomplished using feedback. For example, a resistive feedback around an operational amplifier with a 2:1 ratio can adequately address any common mode variation issues. With a fully-differential op-amp with output common mode feedback, the common mode variation of the detected voltage can be reduced by approximately 33%, bringing it within a range that is conducive to a simpler input stage. If external power detectors are used in addition to power detector 120, the resulting amplified differential voltage signal can be multiplexed with the detector signals from the external power detectors using analog multiplexers.

The amplified differential voltage signal can then be compared with a reference signal to determine whether the power signal is less than, equal to, or greater than a desired level. According to an exemplary embodiment, the differential reference voltage can be generated by means of a 6-bit R-2R digital-to-analog converter (DAC), although the R-2R DAC can be of any resolution, depending upon the application. The R-2R architecture has the advantage that the number of branches increases linearly with the number of bits, compared to an exponential increase for some other architectures. The R-2R architecture also has a monotonous output (i.e., no negative differential non-linearity (DNL)), which is not the case with conventional architecture, such as current-steering. However, any means for generating the reference signal can be used.

According to an exemplary embodiment, the DAC can be single-sided. Thus, the maximum differential output can range from approximately 0V to approximately 1V, instead of a conventional −0.5V to 0.5V range. Since the differential output of the power detector 120 can range from a minimum of approximately 0V to a maximum of approximately 1V, a positive differential reference signal can be used. According to an exemplary embodiment, the DAC can have an input control bit to extend the maximum range to 2V, while keeping the number of bits the same. Consequently, the differential detected voltage and the differential reference voltage can be compared using, for example, a switch-capacitor comparator for comparator 145 that employs, for example, an offset-cancellation scheme. The output of the comparator can then be used to control the output power of the power amplifier 105 according to exemplary embodiments of the present invention.

Figure 3:
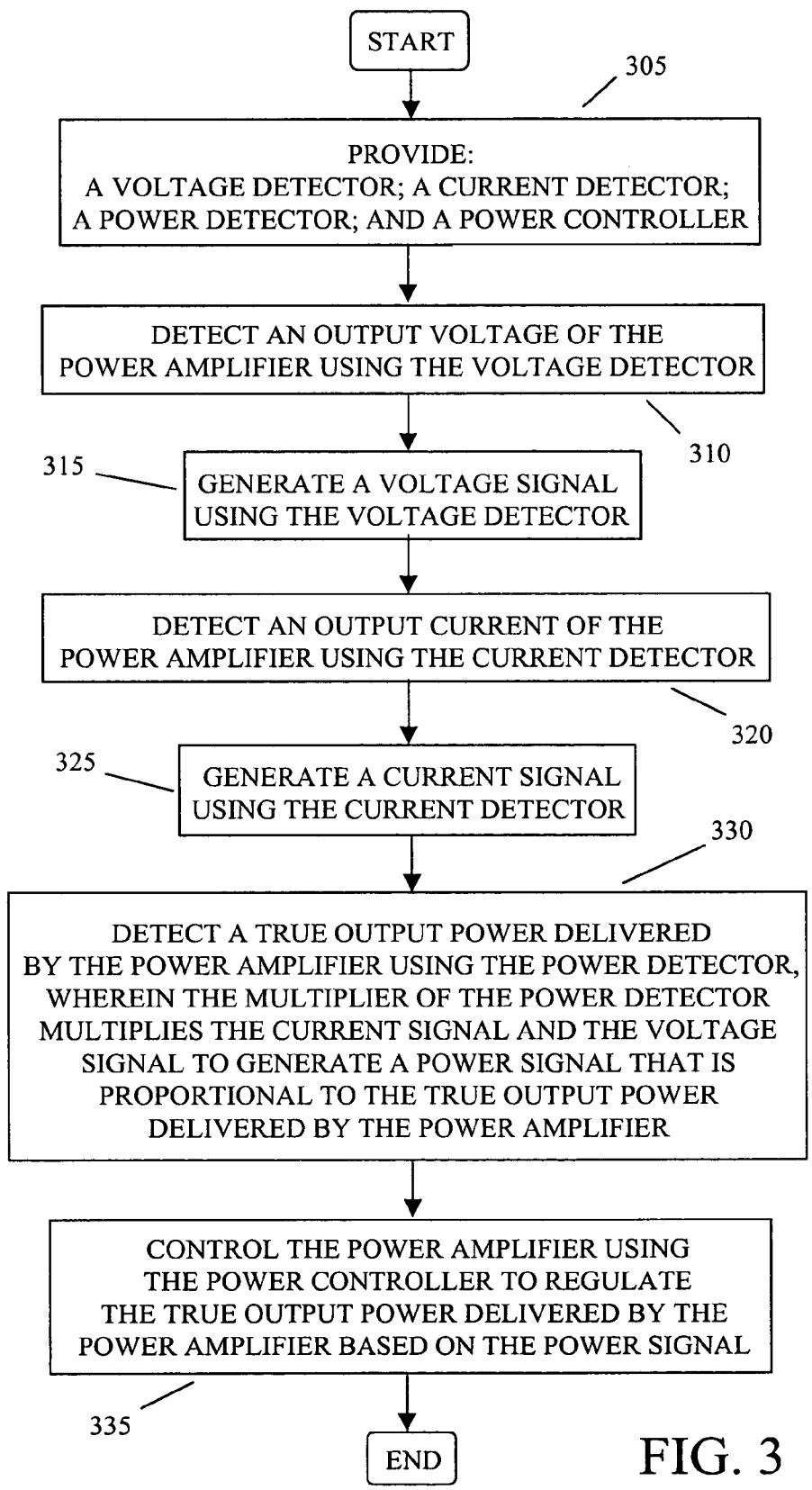
FIG. 3 is a flowchart illustrating steps for controlling true output power of a transmitter, in accordance with an exemplary embodiment of the present invention.

FIG. 3 is a flowchart illustrating steps for controlling true output power of a transmitter, in accordance with an exemplary embodiment of the present invention. In step 305, the following can be provided: a voltage detector in communication with a power amplifier of the transmitter; a current detector in communication with the power amplifier; a power detector in communication with the voltage detector and the current detector; and a power controller in communication with the power detector and the power amplifier. According to exemplary embodiments, the power detector can include a multiplier. In step 310, an output voltage of the power amplifier can be detected using the voltage detector. In step 315, a voltage signal can be generated using the voltage detector. The voltage signal can be proportional to the output voltage of the power amplifier. In step 320, an output current of the power amplifier can be detected using the current detector. In step 325, a current signal can be generated using the current detector. The current signal can be proportional to the output current of the power amplifier.

In step 330, the true output power delivered by the power amplifier can be detected using the power detector. According to exemplary embodiments, the multiplier of the power detector multiplies the current signal and the voltage signal to generate a power signal that is proportional to the true output power delivered by the power amplifier. According to an exemplary embodiment, the voltage signal can comprise a fundamental frequency component of the output voltage of the power amplifier, the current signal can comprise a fundamental frequency component of the output current of the power amplifier, and the power signal can comprise a DC power signal. According to an exemplary embodiment, the multiplier can include a linear multiplier. For example, the linear multiplier can be a Gilbert-cell multiplier. In step 335, the power amplifier can be controlled using the power controller to regulate the true output power delivered by the power amplifier based on the power signal. According to exemplary embodiments, at least the power controller and the power amplifier can be formed on a monolithic substrate. For example, the voltage detector, the current detector and the power detector can also be formed on the monolithic substrate. According to exemplary embodiments, the power amplifier can include at least the power controller. For example, the power amplifier can further include the voltage detector, the current detector and the power detector. According to exemplary embodiments, the method can be compliant with a standard selected from the group consisting of 802.11, 802.11a, 802.11b and 802.11g, or any other wireless or wired standard.

Figure 4:
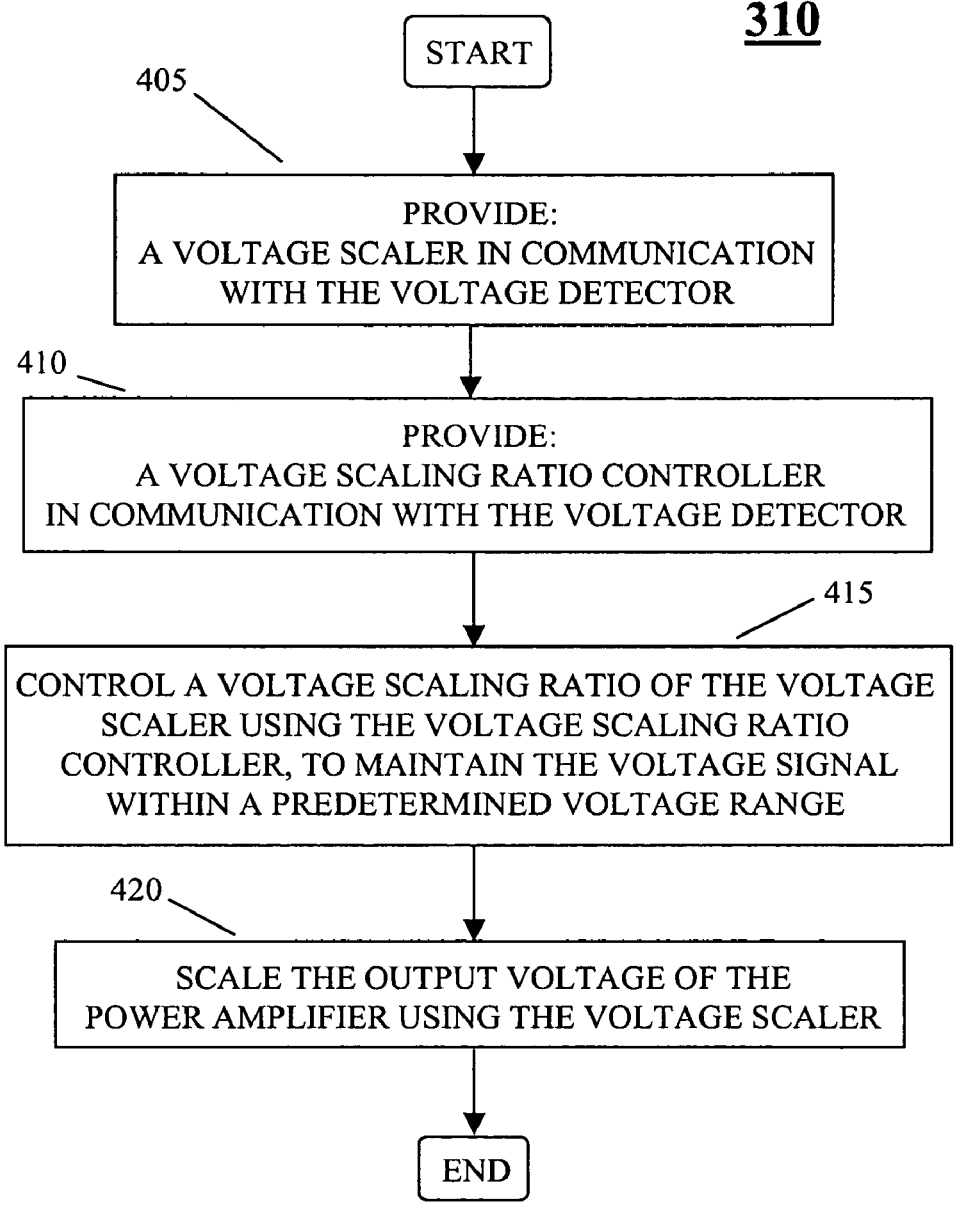
FIG. 4 is a flowchart illustrating steps for detecting an output voltage, in accordance with an exemplary embodiment of the present invention.

FIG. 4 is a flowchart illustrating steps for detecting an output voltage, in accordance with an exemplary embodiment of the present invention. In step 405, a voltage scaler in communication with the voltage detector can be provided. According to exemplary embodiments, the voltage scaler can include a voltage divider. For example, the voltage divider can be a capacitive voltage divider. In step 410, a voltage scaling ratio controller in communication with the voltage detector can be provided. In step 415, a voltage scaling ratio of the voltage scaler can be controlled using the voltage scaling ratio controller, to maintain the voltage signal within a predetermined voltage range. In step 420, the output voltage of the power amplifier can be scaled using the voltage scaler.

Figure 5:
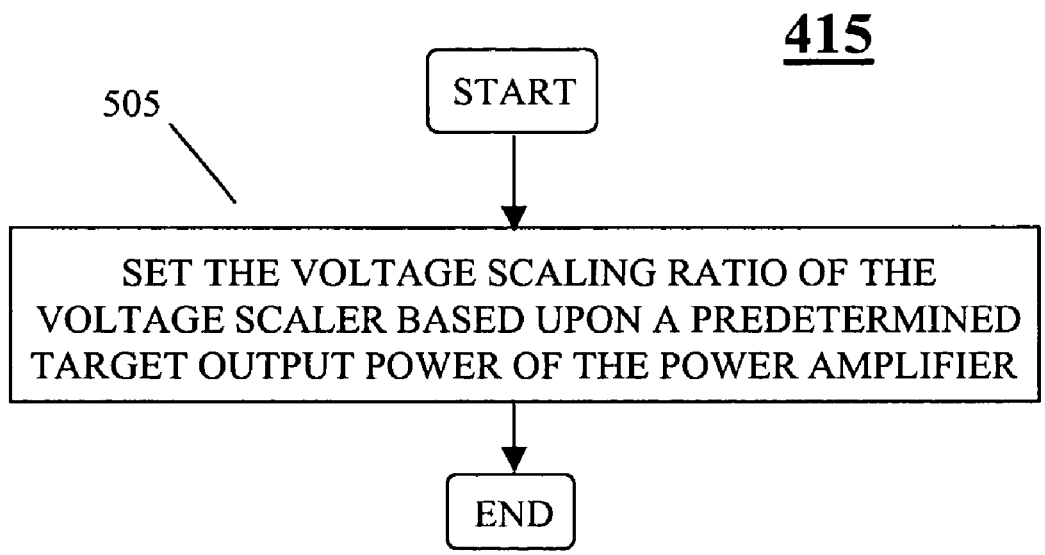
FIG. 5 is a flowchart illustrating steps for controlling a voltage scaling ratio of the voltage scaler, in accordance with an exemplary embodiment of the present invention.

FIG. 5 is a flowchart illustrating steps for controlling a voltage scaling ratio of the voltage scaler, in accordance with an exemplary embodiment of the present invention. In step 505, the voltage scaling ratio of the voltage scaler can be set based upon a predetermined target output power of the power amplifier.

Figure 6:
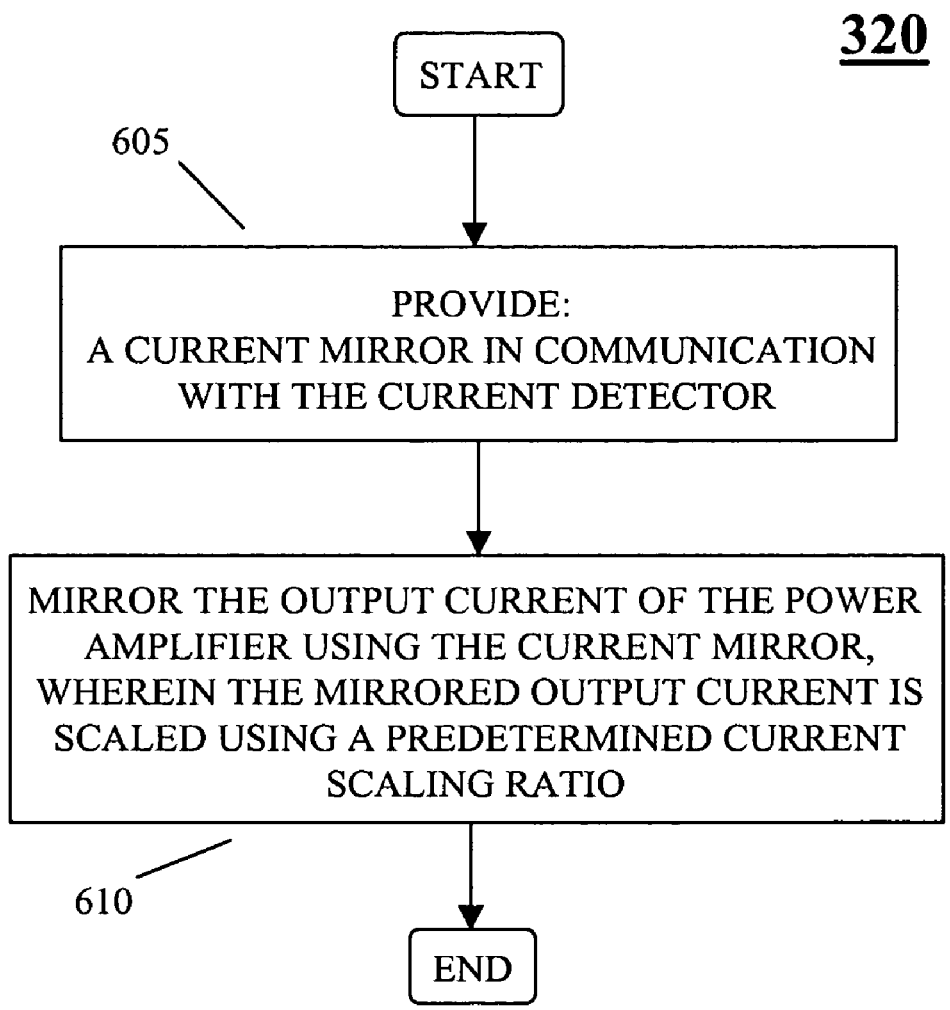
FIG. 6 is a flowchart illustrating steps for detecting an output current, in accordance with an exemplary embodiment of the present invention.

FIG. 6 is a flowchart illustrating steps for detecting an output current, in accordance with an exemplary embodiment of the present invention. In step 605, a current mirror in communication with the current detector can be provided. In step 610, the output current of the power amplifier can be mirrored using the current mirror. The mirrored output current can be scaled using a predetermined current scaling ratio.

Figure 7:
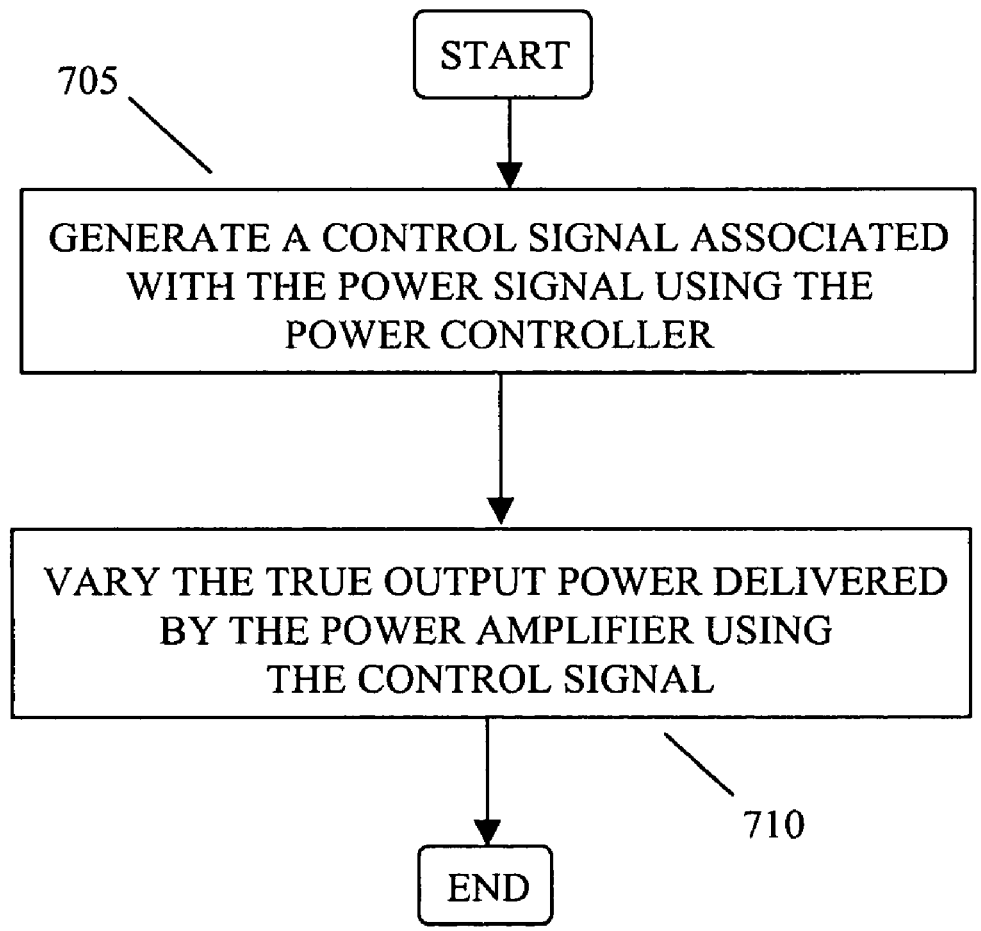
FIG. 7 is a flowchart illustrating steps for controlling the power amplifier, in accordance with an exemplary embodiment of the present invention.

FIG. 7 is a flowchart illustrating steps for controlling the power amplifier, in accordance with an exemplary embodiment of the present invention. In step 705, a control signal associated with the power signal can be generated using the power controller. In step 710, the true output power delivered by the power amplifier can be varied using the control signal.

Figure 8:
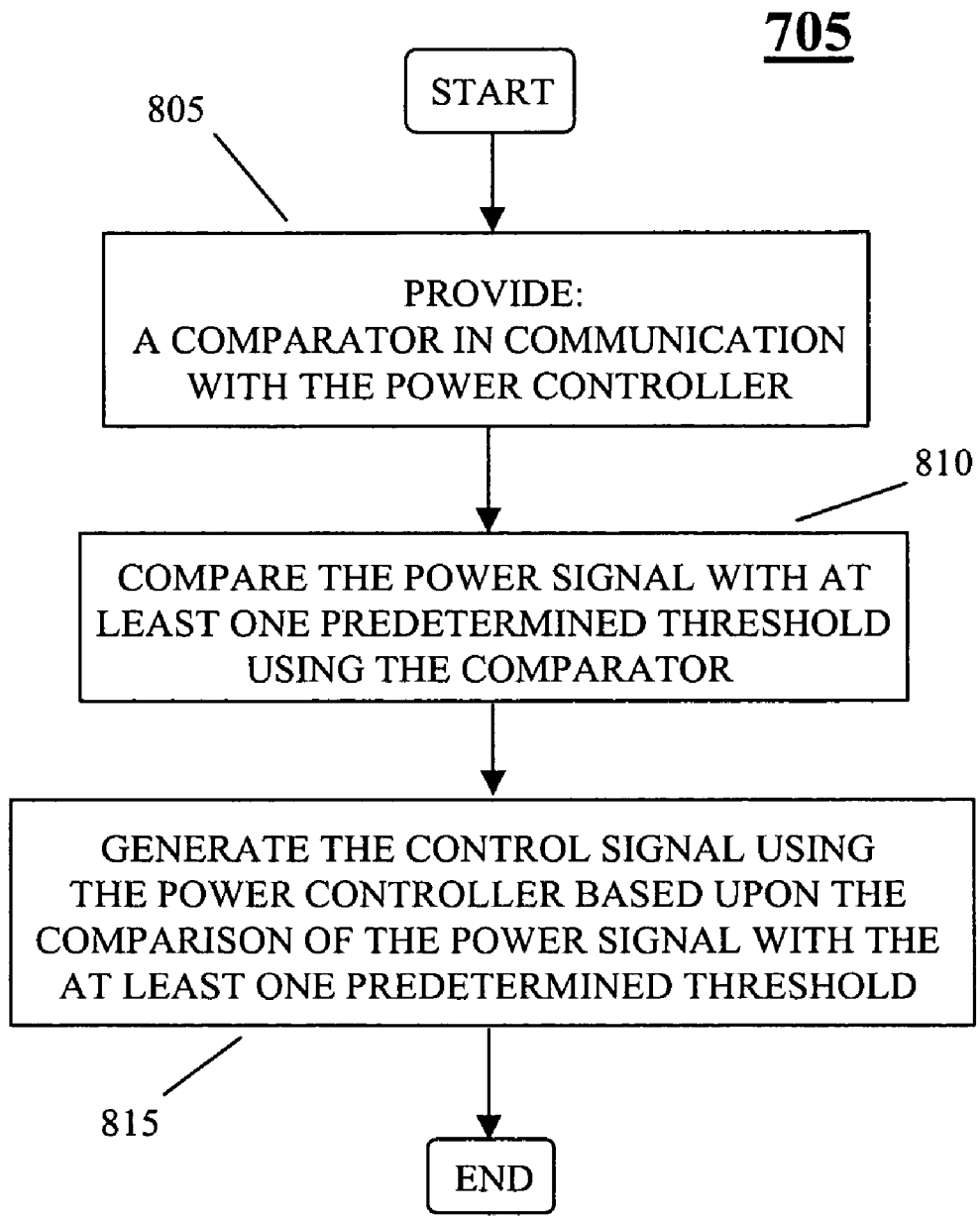
FIG. 8 is a flowchart illustrating steps for generating a control signal, in accordance with an exemplary embodiment of the present invention.

FIG. 8 is a flowchart illustrating steps for generating a control signal, in accordance with an exemplary embodiment of the present invention. In step 805, a comparator in communication with the power controller can be provided. In step 810, the power signal can be compared with at least one predetermined threshold using the comparator. In step 815, the control signal can be generated using the power controller, based upon the comparison of the power signal with the at least one predetermined threshold.

Figure 9A:
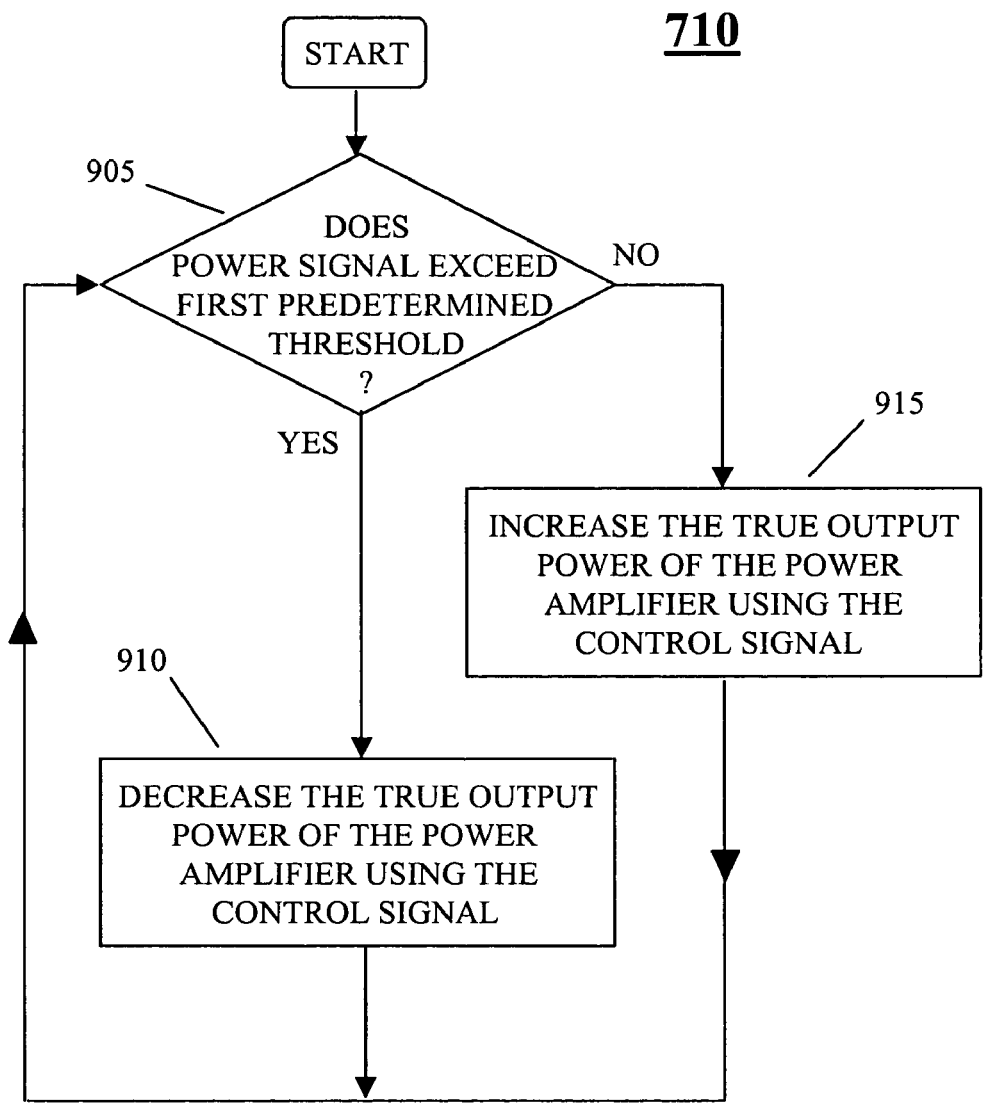
FIG. 9A is a flowchart illustrating steps for varying a true output power, in accordance with an exemplary embodiment of the present invention.

FIG. 9A is a flowchart illustrating steps for varying a true output power, in accordance with an exemplary embodiment of the present invention. According to an exemplary embodiment, the at least one predetermined threshold can comprise a first predetermined threshold. In step 905, a determination can be made as to whether the power signal exceeds the first predetermined threshold. In step 910, the true output power of the power amplifier can be decreased using the control signal, when the power signal exceeds the first predetermined threshold. In step 915, the true output power of the power amplifier can be increased using the control signal, when the power signal is less than the first predetermined threshold.

Figure 9B:
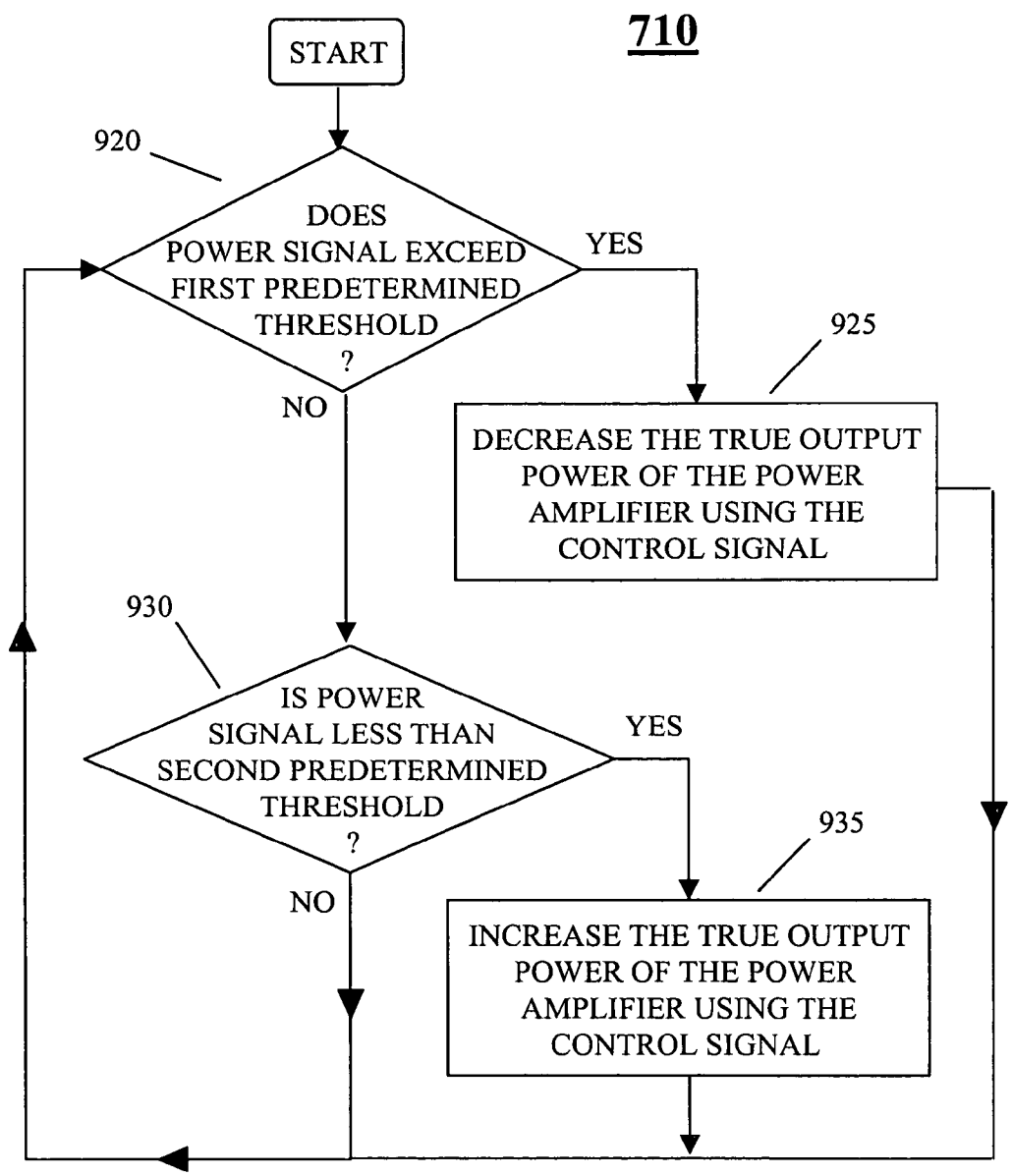
FIG. 9B is a flowchart illustrating steps for varying a true output power, in accordance with an alternative exemplary embodiment of the present invention.

FIG. 9B is a flowchart illustrating steps for varying a true output power, in accordance with an alternative exemplary embodiment of the present invention. According to the alternative exemplary embodiment, the at least one predetermined threshold can comprise a first predetermined threshold and a second predetermined threshold. The first predetermined threshold can be greater than the second predetermined threshold. In step 920, a determination can be made as to whether the power signal exceeds the first predetermined threshold. In step 925, the true output power of the power amplifier can be decreased using the control signal, when the power signal exceeds the first predetermined threshold. If the power signal does not exceed the first predetermined threshold, then in step 930, a determination can be made as to whether the power signal is less than the second predetermined threshold. In step 935, the true output power of the power amplifier can be increased using the control signal, when the power signal is less than the second predetermined threshold.

Figure 10:
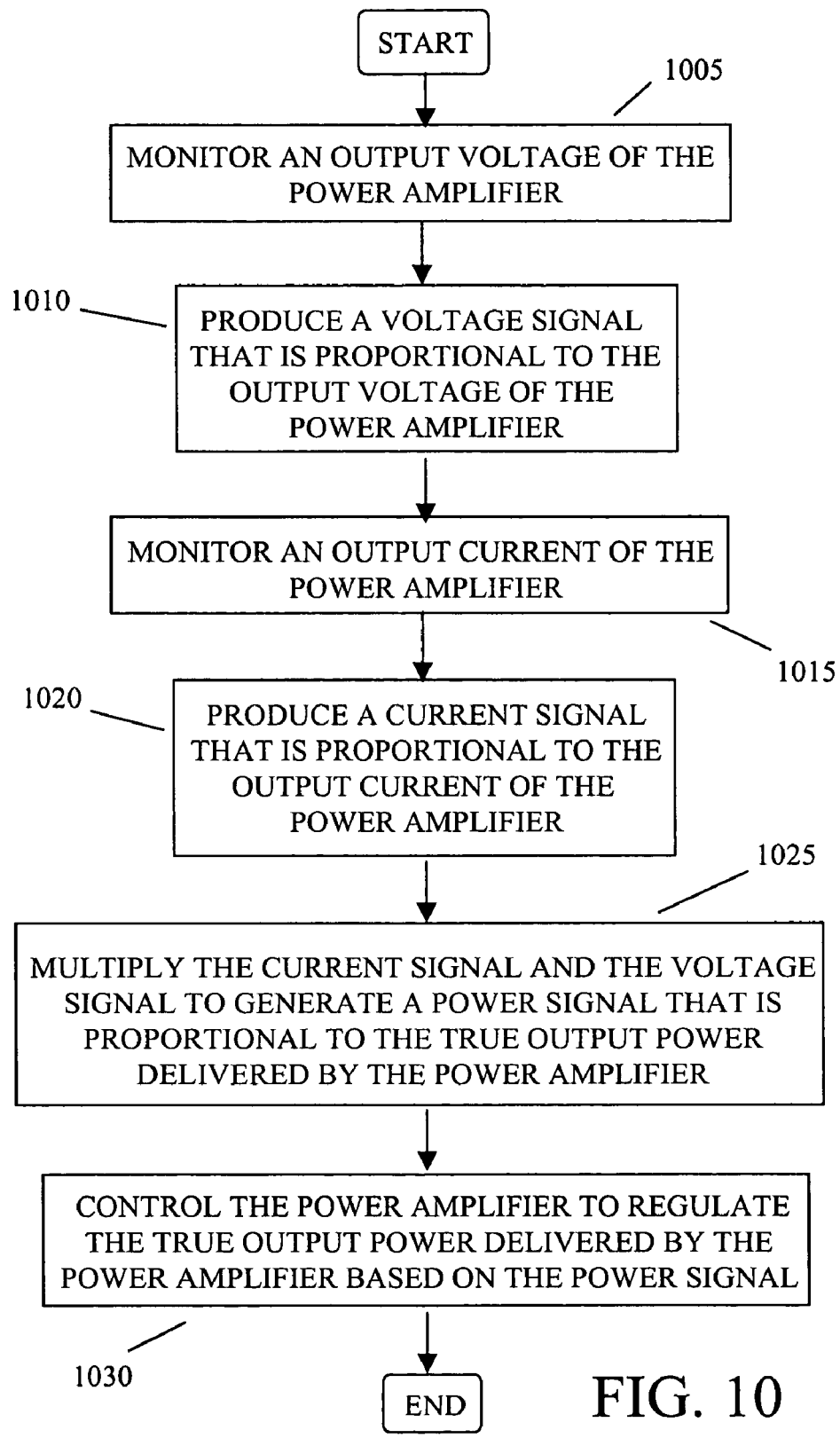
FIG. 10 is a flowchart illustrating steps for controlling true output power of a transmitter, in accordance with an exemplary embodiment of the present invention.

FIG. 10 is a flowchart illustrating steps for controlling true output power of a transmitter, in accordance with an exemplary embodiment of the present invention. In step 1005, an output voltage of a power amplifier of the transmitter can be monitored. In step 1010, a voltage signal can be produced that is proportional to the output voltage of the power amplifier. In step 1015, an output current of the power amplifier can be monitored. In step 1020, a current signal can be produced that is proportional to the output current of the power amplifier. In step 1025, the current signal and the voltage signal can be multiplied to generate a power signal. According to exemplary embodiments, the power signal is proportional to a true output power delivered by the power amplifier. According to an exemplary embodiment, the voltage signal can comprise a fundamental frequency component of the output voltage of the power amplifier, the current signal can comprise a fundamental frequency component of the output current of the power amplifier, and the power signal can comprise a DC power signal. In step 1030, the power amplifier can be controlled to regulate the true output power delivered by the power amplifier based on the power signal. According to exemplary embodiments, the method can be compliant with a standard selected from the group consisting of 802.11, 802.11a, 802.11b and 802.11g, or any other wireless or wired standard.

Figure 11:
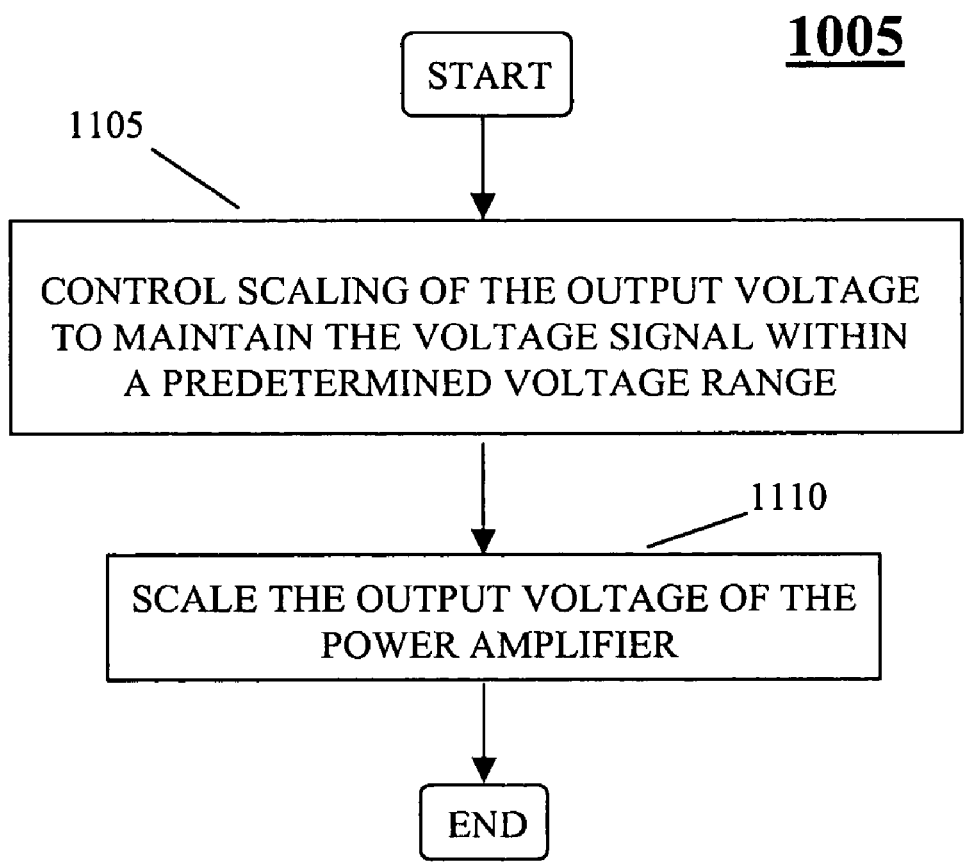
FIG. 11 is a flowchart illustrating steps for monitoring an output voltage, in accordance with an exemplary embodiment of the present invention.
Figure 12:
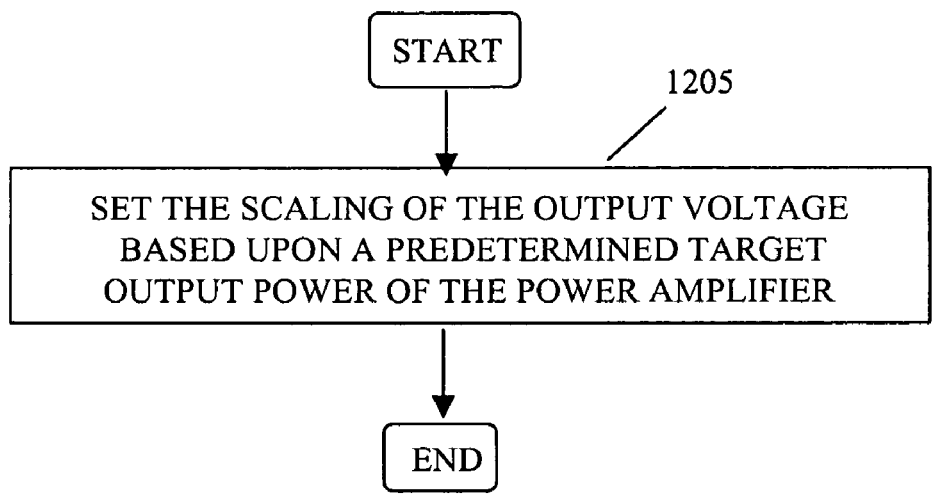
FIG. 12 is a flowchart illustrating steps for controlling scaling of the output voltage of the power amplifier, in accordance with an exemplary embodiment of the present invention.

FIG. 11 is a flowchart illustrating steps for monitoring an output voltage, in accordance with an exemplary embodiment of the present invention. In step 1105, the scaling of the output voltage can be controlled to maintain the voltage signal within a predetermined voltage range. In step 1110, the output voltage of the power amplifier can be scaled. FIG. 12 is a flowchart illustrating steps for controlling scaling of the output voltage of the power amplifier, in accordance with an exemplary embodiment of the present invention. In step 1205, the scaling of the output voltage can be set based upon a predetermined target output power of the power amplifier.

Figure 13:
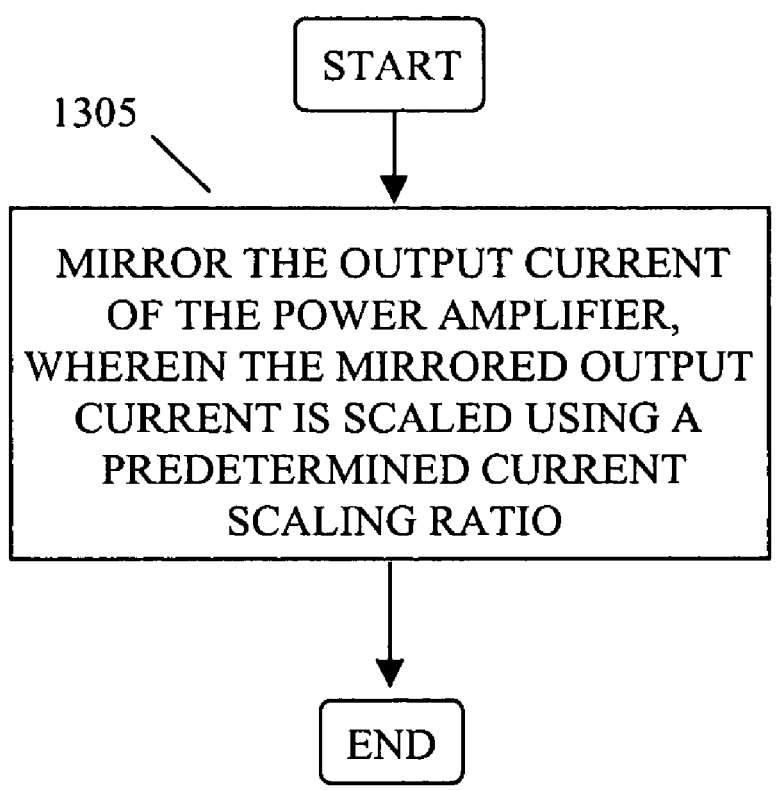
FIG. 13 is a flowchart illustrating steps for monitoring an output current, in accordance with an exemplary embodiment of the present invention.

FIG. 13 is a flowchart illustrating steps for monitoring an output current, in accordance with an exemplary embodiment of the present invention. In step 1305, the output current of the power amplifier can be mirrored. According to exemplary embodiments, the mirrored output current can be scaled using a predetermined current scaling ratio.

Figure 14:
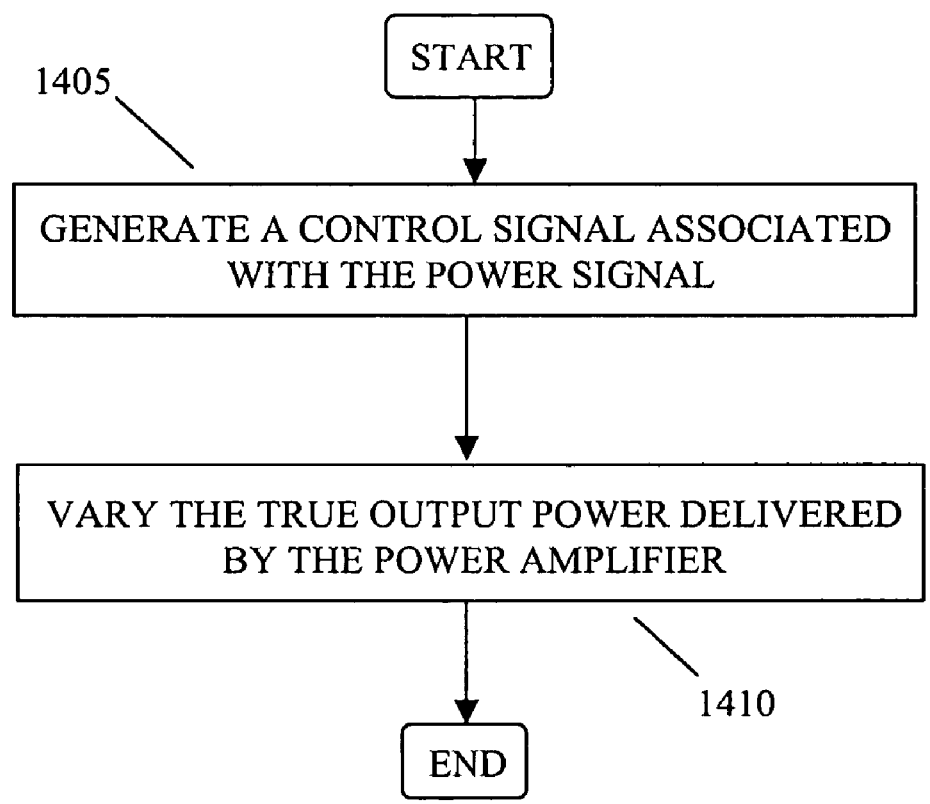
FIG. 14 is a flowchart illustrating steps for controlling the power amplifier, in accordance with an exemplary embodiment of the present invention.

FIG. 14 is a flowchart illustrating steps for controlling the power amplifier, in accordance with an exemplary embodiment of the present invention. In step 1405, a control signal associated with the power signal can be generated. In step 1410, the true output power delivered by the power amplifier can be varied using the control signal.

Figure 15:
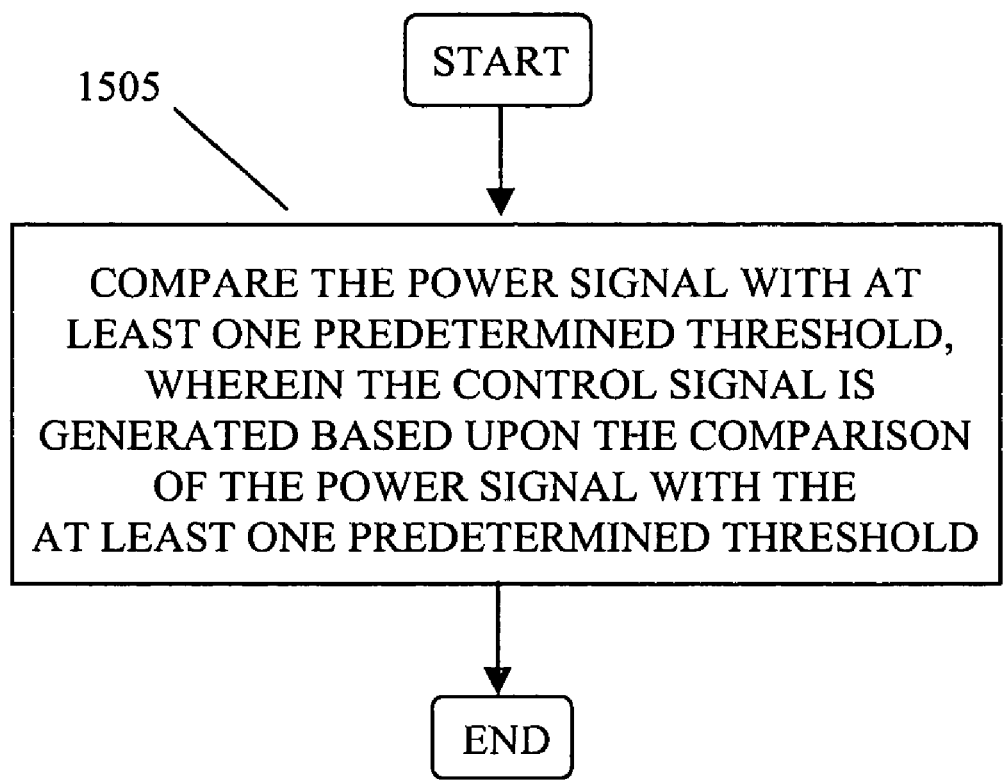
FIG. 15 is a flowchart illustrating steps for generating a control signal, in accordance with an exemplary embodiment of the present invention.

FIG. 15 is a flowchart illustrating steps for generating a control signal, in accordance with an exemplary embodiment of the present invention. In step 1505, the power signal can be compared with at least one predetermined threshold. According to exemplary embodiments, the control signal can be generated based upon the comparison of the power signal with the at least one predetermined threshold.

Figure 16A:
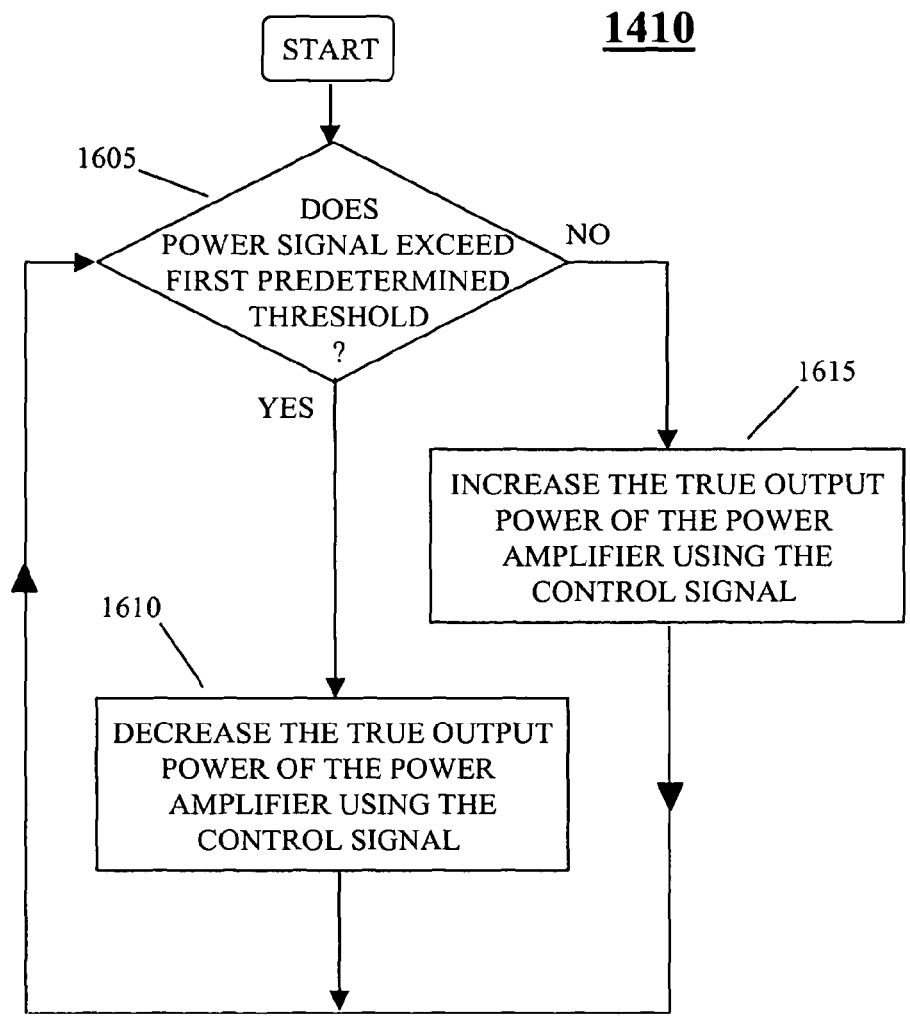
FIG. 16A is a flowchart illustrating steps for varying a true output power delivered by a power amplifier, in accordance with an exemplary embodiment of the present invention.

FIG. 16A is a flowchart illustrating steps for varying a true output power, in accordance with an exemplary embodiment of the present invention. According to an exemplary embodiment, the at least one predetermined threshold can comprise a first predetermined threshold. In step 1605, a determination can be made as to whether the power signal exceeds the first predetermined threshold. In step 1610, the true output power of the power amplifier can be decreased using the control signal, when the power signal exceeds the first predetermined threshold. In step 1615, the true output power of the power amplifier can be increased using the control signal, when the power signal is less than the first predetermined threshold.

Figure 16B:
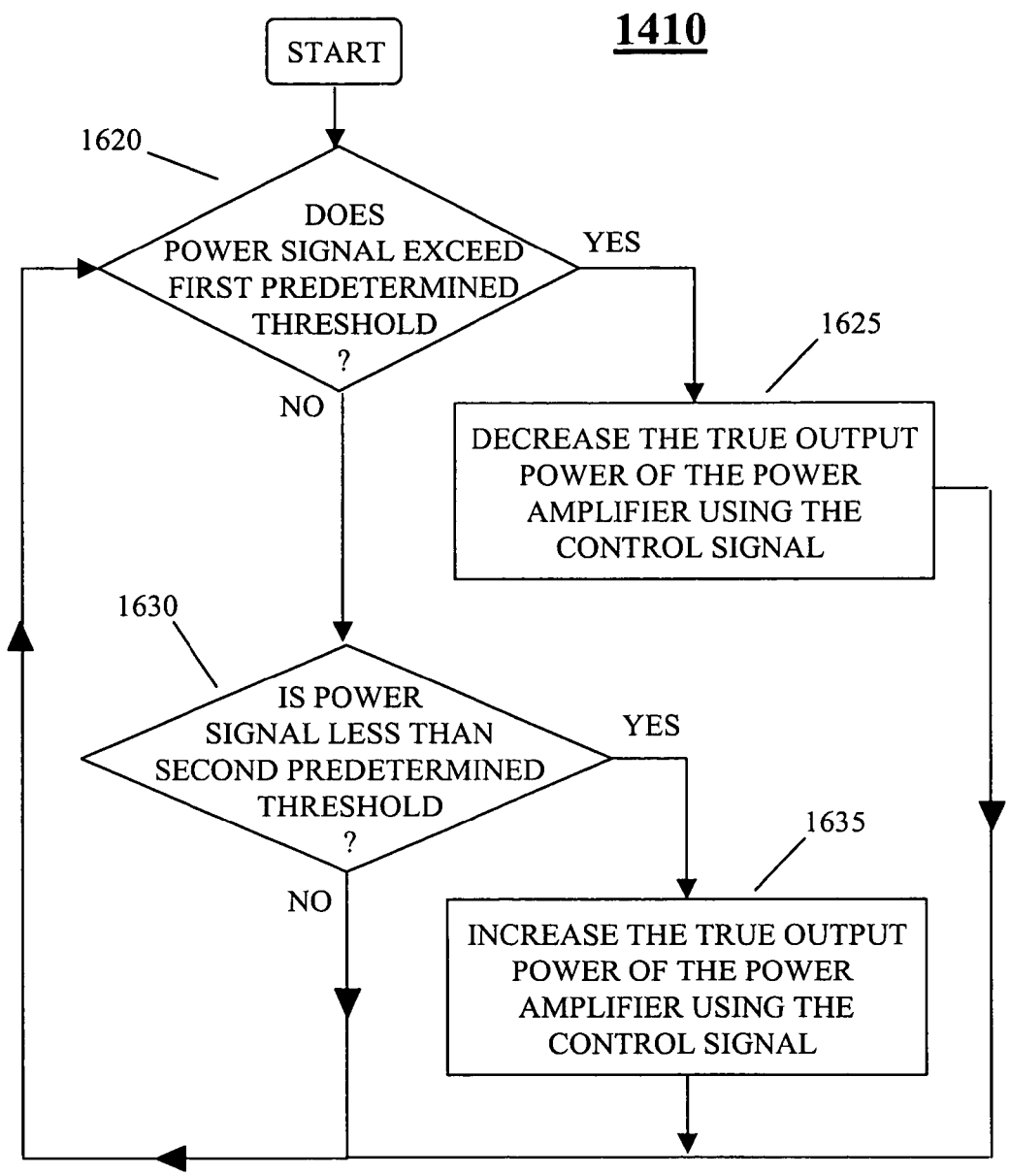
FIG. 16B is a flowchart illustrating steps for varying a true output power delivered by a power amplifier, in accordance with an alternative exemplary embodiment of the present invention.

FIG. 16B is a flowchart illustrating steps for varying a true output power, in accordance with an alternative exemplary embodiment of the present invention. According to the alternative exemplary embodiment, the at least one predetermined threshold can comprise a first predetermined threshold and a second predetermined threshold. The first predetermined threshold can be greater than the second predetermined threshold. In step 1620, a determination can be made as to whether the power signal exceeds the first predetermined threshold. In step 1625, the true output power of the power amplifier can be decreased using the control signal, when the power signal exceeds the first predetermined threshold. If the power signal does not exceed the first predetermined threshold, then in step 1630, a determination can be made as to whether the power signal is less than the second predetermined threshold. In step 1635, the true output power of the power amplifier can be increased using the control signal, when the power signal is less than the second predetermined threshold.

The steps of a computer program as illustrated in FIGS. 3-16B for controlling true output power of a transmitter can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Exemplary embodiments of the present invention can be used in any device or system that communicates information, including both wired and wireless communication systems, particularly where power consumption is a concern and/or power regulation is required. For example, exemplary embodiments can be used in cellular telephone and other wireless communication and wireless computing devices.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A transmitter power control system, comprising:
   a voltage detector configured to generate a voltage signal that is proportional to an output voltage of a power amplifier of a transmitter, the voltage detector including:
      a voltage scaler configured to scale the output voltage of the power amplifier using a voltage scaling ratio, wherein the voltage scaling ratio scales down the output voltage; and
      a voltage scaling ratio controller configured to adjust the voltage scaling ratio to maintain the voltage signal within a predetermined voltage range;
   a current detector configured to generate a current signal that is proportional to an output current of the power amplifier, the current detector including a current scaler configured to scale the output current using a predetermined current scaling ratio, wherein the predetermined current scaling ratio scales down the output current;
   a power detector configured to generate a power signal that is i) based on the current signal and the voltage signal, and ii) proportional to an output power of the power amplifier; and a power controller configured to generate a control signal to vary the output power based on a comparison of the power signal with at least one predetermined threshold.

2. The transmitter power control system of claim 1, wherein the predetermined voltage range is based on a plurality of stored target output power levels and corresponding voltage scaling ratios.

3. The transmitter power control system of claim 1, wherein the voltage signal comprises a fundamental frequency component of the output voltage of the power amplifier, wherein the current signal comprises a fundamental frequency component of the output current of the power amplifier, and wherein the power signal comprises a DC power signal.

4. The transmitter power control system of claim 1, wherein the voltage scaler comprises a voltage divider.

5. The transmitter power control system of claim 4, wherein the voltage divider comprises a capacitive voltage divider.

6. The transmitter power control system of claim 1, wherein the voltage scaling ratio controller is configured to set the voltage scaling ratio of the voltage scaler based upon a predetermined target output power of the power amplifier.

7. The transmitter power control system of claim 1, wherein the at least one predetermined threshold comprises a first predetermined threshold and a second predetermined threshold,
wherein the first predetermined threshold is greater than the second predetermined threshold, and
wherein the control signal i) reduces the output power of the power amplifier when the power signal exceeds the first predetermined threshold, and ii) increases the output power of the power amplifier when the power signal is less than the second predetermined threshold.

8. The transmitter power control system of claim 1, wherein the at least one predetermined threshold comprises a first predetermined threshold, and
wherein the control signal i) decreases the output power of the power amplifier when the power signal exceeds the first predetermined threshold, and ii) increases the output power of the power amplifier when the power signal is less than the first predetermined threshold.

9. The transmitter power control system of claim 1, wherein the power detector includes a linear multiplier.

10. The transmitter power control system of claim 9, wherein the linear multiplier comprises a Gilbert-cell multiplier.

11. The transmitter power control system of claim 1, wherein at least the power controller and the power amplifier are formed on a monolithic substrate.

12. The transmitter power control system of claim 11, wherein the voltage detector, the current detector and the power detector are formed on the monolithic substrate.

13. A method for controlling output power of a transmitter, the method comprising:
generating a voltage signal that is proportional to an output voltage of a power amplifier of a transmitter;
scaling the output voltage of the power amplifier using a voltage scaling ratio, wherein the voltage scaling ratio scales down the output voltage;
adjusting the voltage scaling ratio to maintain the voltage signal within a predetermined voltage range;
generating a current signal that is proportional to an output current of the power amplifier;
scaling the output current using a predetermined current scaling ratio, wherein the predetermined current scaling ratio scales down the output current;
generating a power signal that is i) based on the current signal and the voltage signal, and ii) proportional to an output power of the power amplifier;
controlling the power amplifier to regulate the output power based on the power signal; and
generating a control signal to vary the output power based on a comparison of the power signal with at least one predetermined threshold.

14. The method of claim 13, wherein the predetermined voltage range is based on a plurality of stored target output power levels and corresponding voltage scaling ratios.

15. The method of claim 13, wherein the voltage signal comprises a fundamental frequency component of the output voltage of the power amplifier, wherein the current signal comprises a fundamental frequency component of the output current of the power amplifier, and wherein the power signal comprises a DC power signal.

16. The method of claim 13 further comprising setting the voltage scaling ratio based upon a predetermined target output power of the power amplifier.

17. The method of claim 13, wherein the at least one predetermined threshold comprises a first predetermined threshold and a second predetermined threshold,
wherein the first predetermined threshold is greater than the second predetermined threshold, and
wherein the control signal i) reduces the output power of the power amplifier when the power signal exceeds the first predetermined threshold, and ii) increases the output power of the power amplifier when the power signal is less than the second predetermined threshold.

18. The method of claim 13, wherein the at least one predetermined threshold comprises a first predetermined threshold, and
wherein the control signal i) decreases the output power of the power amplifier when the power signal exceeds the first predetermined threshold, and ii) increases the output power of the power amplifier when the power signal is less than the first predetermined threshold.

* * * * *